(12) United States Patent
Gopalraja et al.

(10) Patent No.: US 7,504,006 B2
(45) Date of Patent: *Mar. 17, 2009

(54) SELF-IONIZED AND CAPACITIVELY-COUPLED PLASMA FOR SPUTTERING AND RESPUTTERING

(75) Inventors: Praburam Gopalraja, San Jose, CA (US); Jianming Fu, Palo Alto, CA (US); Xianmin Tang, San Jose, CA (US); John C. Forster, San Francisco, CA (US); Umesh Kelkar, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 36 days.

This patent is subject to a terminal disclaimer.

(21) Appl. No.: 10/632,882

(22) Filed: Jul. 31, 2003

(65) Prior Publication Data
US 2004/0094402 A1    May 20, 2004

Related U.S. Application Data

(60) Provisional application No. 60/400,097, filed on Aug. 1, 2002.

(51) Int. Cl.
 C23C 14/35 (2006.01)
(52) U.S. Cl. ............... 204/192.12; 204/192.17; 204/192.3; 204/298.03; 204/298.06; 204/298.2; 204/298.16
(58) Field of Classification Search .............. 204/192.3, 204/192.12, 298.06, 298.2, 298.16, 298.03, 204/192.17
See application file for complete search history.

(56) References Cited

U.S. PATENT DOCUMENTS
4,412,905 A  11/1983  Khan ............... 204/298.16
4,498,969 A  2/1985  Ramachandran ....... 204/298.12
(Continued)

FOREIGN PATENT DOCUMENTS
DE  2707144  8/1977
(Continued)

OTHER PUBLICATIONS
PCT/US02/36940 International Search Report mailed Feb. 14, 2003, (7094PCT).
(Continued)

Primary Examiner—Rodney G McDonald
(74) Attorney, Agent, or Firm—Konrad Raynes Victor & Mann, LLP

(57) ABSTRACT

A DC magnetron sputter reactor for sputtering deposition materials such as tantalum and tantalum nitride, for example, and its method of use, in which self-ionized plasma (SIP) sputtering and capacitively coupled plasma (CCP) sputtering are promoted, either together or alternately, in the same chamber. Also, bottom coverage may be thinned or eliminated by inductively-coupled plasma (ICP) resputtering. SIP is promoted by a small magnetron having poles of unequal magnetic strength and a high power applied to the target during sputtering. CCP is provided by a pedestal electrode which capacitively couples RF energy into a plasma. The CCP plasma is preferably enhanced by a magnetic field generated by electromagnetic coils surrounding the pedestal which act to confine the CCP plasma and increase its density.

45 Claims, 8 Drawing Sheets

U.S. PATENT DOCUMENTS

| | | | |
|---|---|---|---|
| 4,581,118 A | 4/1986 | Class et al. | 204/298.16 |
| 4,673,482 A | 6/1987 | Setoyama et al. | 204/298.16 |
| 4,761,219 A | 8/1988 | Sasaki et al. | 204/298.37 |
| 4,853,102 A | 8/1989 | Tateishi et al. | 204/298.06 |
| 4,865,709 A | 9/1989 | Nakagawa et al. | 204/298.12 |
| 4,865,712 A | 9/1989 | Mintz | 204/298.16 |
| 4,871,433 A | 10/1989 | Wagner et al. | 204/192.12 |
| 5,006,218 A | 4/1991 | Yoshida et al. | 204/298.06 |
| 5,026,470 A | 6/1991 | Bonyhard et al. | 204/298.16 |
| 5,108,570 A | 4/1992 | Wang | |
| 5,178,739 A | 1/1993 | Barnes et al. | 204/192.12 |
| 5,186,718 A | 2/1993 | Tepman et al. | 29/25.01 |
| 5,246,532 A | 9/1993 | Ishida | 156/340.46 |
| 5,308,417 A | 5/1994 | Groechel et al. | 216/67 |
| 5,431,799 A | 7/1995 | Mosely et al. | 204/298.06 |
| 5,439,574 A | 8/1995 | Kobayashi et al. | 204/192.12 |
| 5,455,197 A | 10/1995 | Ghanbari et al. | 438/685 |
| 5,456,796 A | 10/1995 | Gupta et al. | 438/710 |
| 5,496,455 A | 3/1996 | Dill et al. | |
| 5,589,039 A | 12/1996 | Hsu | 204/192.12 |
| 5,593,551 A | 1/1997 | Lai | 204/192.12 |
| 5,736,021 A | 4/1998 | Ding et al. | 204/298.11 |
| 5,770,519 A | 6/1998 | Klein et al. | |
| 5,846,332 A | 12/1998 | Zhao et al. | |
| 5,897,752 A | 4/1999 | Hong et al. | |
| 5,902,461 A | 5/1999 | Xu et al. | 204/192.12 |
| 5,907,220 A | 5/1999 | Tepman et al. | 315/111.41 |
| 5,933,753 A | 8/1999 | Simon et al. | 438/629 |
| 5,985,762 A | 11/1999 | Geffken et al. | 438/687 |
| 6,017,144 A | 1/2000 | Guo et al. | |
| 6,042,700 A | 3/2000 | Gopalraja et al. | 204/192.15 |
| 6,054,770 A | 4/2000 | Toyoda et al. | |
| 6,077,403 A | 6/2000 | Kobayashi et al. | 204/192.12 |
| 6,080,285 A | 6/2000 | Liu | |
| 6,099,706 A | 8/2000 | Hirabayashi et al. | 204/298.16 |
| 6,100,587 A | 8/2000 | Merchant et al. | |
| 6,106,625 A | 8/2000 | Koai et al. | |
| 6,106,682 A | 8/2000 | Moslehi et al. | 204/298.15 |
| 6,110,821 A | 8/2000 | Kohara | |
| 6,113,731 A | 9/2000 | Shan et al. | 156/345.28 |
| 6,121,134 A | 9/2000 | Burton et al. | |
| 6,136,166 A | 10/2000 | Shen et al. | 204/298.16 |
| 6,136,707 A | 10/2000 | Cohen | |
| 6,149,776 A | 11/2000 | Tang et al. | 204/192.12 |
| 6,159,351 A | 12/2000 | J'Afer et al. | 204/298.19 |
| 6,174,811 B1 | 1/2001 | Ding et al. | 438/687 |
| 6,179,973 B1 | 1/2001 | Lai et al. | 204/192.12 |
| 6,183,614 B1 | 2/2001 | Fu | 204/298.2 |
| 6,193,854 B1 | 2/2001 | Lai | |
| 6,193,855 B1 | 2/2001 | Gopalraja et al. | 204/192.12 |
| 6,224,724 B1 | 5/2001 | Licata et al. | 204/298.06 |
| 6,235,164 B1 | 5/2001 | Gerrish et al. | 204/192.2 |
| 6,251,242 B1 | 6/2001 | Fu et al. | 204/298.19 |
| 6,255,192 B1 | 7/2001 | Dornisch | |
| 6,265,313 B1 | 7/2001 | Huang et al. | |
| 6,274,008 B1 | 8/2001 | Gopalraja et al. | 204/192.17 |
| 6,277,249 B1 | 8/2001 | Gopalraja et al. | 204/192.12 |
| 6,280,585 B1 | 8/2001 | Obinata et al. | 204/298.12 |
| 6,284,657 B1 | 9/2001 | Chooi et al. | |
| 6,287,977 B1 | 9/2001 | Hashim et al. | 408/722 |
| 6,294,458 B1 | 9/2001 | Zhang et al. | |
| 6,306,265 B1 | 10/2001 | Fu et al. | 204/192.12 |
| 6,306,732 B1 | 10/2001 | Brown | |
| 6,323,124 B1 | 11/2001 | Leiphart | |
| 6,328,871 B1 | 12/2001 | Ding et al. | |
| 6,342,133 B2 | 1/2002 | D'Couto et al. | 204/192.17 |
| 6,350,353 B2 | 2/2002 | Gopalraja et al. | 204/192.3 |
| 6,352,629 B1 | 3/2002 | Wang | 204/298.2 |
| 6,358,376 B1 | 3/2002 | Wang | |
| 6,368,469 B1 | 4/2002 | Nulman et al. | 204/192.12 |
| 6,368,954 B1 | 4/2002 | Lopatin et al. | |
| 6,375,810 B2 | 4/2002 | Hong | 204/192.12 |
| 6,391,785 B1 | 5/2002 | Satta et al. | |
| 6,398,929 B1 | 6/2002 | Chiang et al. | 204/298.11 |
| 6,413,383 B1 | 7/2002 | Chiang et al. | 204/192.13 |
| 6,423,192 B1 | 7/2002 | Wada et al. | 204/192.12 |
| 6,436,267 B1 | 8/2002 | Carl et al. | 205/186 |
| 6,475,356 B1 | 11/2002 | Ngan et al. | 204/192.17 |
| 6,498,091 B1 | 12/2002 | Chen et al. | 438/627 |
| 6,506,287 B1 | 1/2003 | Ding | 204/192.12 |
| 6,554,979 B2 | 4/2003 | Stimson | 204/298.06 |
| 6,579,421 B1 | 6/2003 | Fu | 204/192.12 |
| 6,607,977 B1 | 8/2003 | Rozbicki et al. | |
| 6,610,184 B2 | 8/2003 | Ding et al. | |
| 6,642,146 B1 | 11/2003 | Rozbicki et al. | |
| 6,692,617 B1 | 2/2004 | Fu et al. | 204/192.12 |
| 6,755,945 B2 | 6/2004 | Yasar et al. | |
| 6,762,125 B1 | 7/2004 | Polinsky et al. | |
| 6,764,940 B1 | 7/2004 | Rozbicki et al. | |
| 6,784,096 B2 | 8/2004 | Chen et al. | |
| 7,026,238 B2 | 4/2006 | Xi et al. | |
| 2001/0003607 A1 | 6/2001 | Gopalraja et al. | |
| 2002/0110999 A1 | 8/2002 | Lu et al. | |
| 2003/0116427 A1 | 6/2003 | Ding et al. | |
| 2003/0217914 A1* | 11/2003 | Miller et al. | 204/192.12 |
| 2004/0020770 A1* | 2/2004 | Wang et al. | 204/298.18 |
| 2004/0094402 A1 | 5/2004 | Gopalraja et al. | |
| 2005/0006222 A1* | 1/2005 | Ding et al. | 204/192.1 |
| 2005/0252765 A1 | 11/2005 | Zhang | |
| 2005/0255690 A1 | 11/2005 | Chen | |
| 2005/0255691 A1 | 11/2005 | Ding et al. | |
| 2005/0255692 A1 | 11/2005 | Yang et al. | |
| 2005/0266682 A1 | 12/2005 | Chen | |
| 2005/0272254 A1 | 12/2005 | Ding et al. | |
| 2008/0142359 A1* | 6/2008 | GOPALRAJA et al. | 204/298.16 |

FOREIGN PATENT DOCUMENTS

| | | |
|---|---|---|
| DE | 0261812 | 6/1987 |
| EP | 0799903 | 10/1997 |
| EP | 1119017 | 7/2001 |
| JP | 61158032 | 7/1986 |
| JP | 61221363 | 10/1986 |
| JP | 61272373 | 12/1986 |
| JP | 63018071 | 1/1988 |
| JP | 63213667 | 9/1988 |
| JP | 63262462 | 10/1988 |
| JP | 1309963 | 12/1989 |
| JP | 10152774 | 6/1998 |
| JP | 2000323571 | 11/2000 |
| WO | 0007236 | 2/2000 |
| WO | 03042424 | 5/2003 |

OTHER PUBLICATIONS

PCT/US02/39510 International Search Report mailed May 2, 2003 (7074PCT).

Apblett, C., et al. "Silicon nitride growth in a high-density plasma system," Solid State Technology, Nov. 1995, pp. 73-80.

Bader, H.P., et al. "Planarization by radio-frequency bias sputtering of aluminum as studied experimentally and by computer simulation," J. Vac. Sci. Technol. A., Nov./Dec. 1985, pp. 2167-2171.

Cheng, P., et al. "Directional deposition of Cu into semiconductor trench structures using ionized magnetron sputtering," J. Vac Sci. Technol. B., 13(2), Mar./Apr. 1995, pp. 203-208.

Getty, Ward D. "Size-scalable, 2.45-Ghz electron cylotron resonance plasma source using permanent magnets and waveguide coupling," J. Vac Sci. Technol.B 12(1), Jan./Feb. 1994, pp. 408-415.

Gorbatkin, S.M., et al. "Cu metallization using a permanent magnet electron cyclotron resonance microwave plasma/sputtering hybrid system," J. Vac. Sci. Technol. B, vol. 14, No. 3, May/Jun. 1996, pp. 1853-1859.

Hamaguchi, S., et al. "Simulations of trench-filling profiles under ionized magnetron sputter metal deposition," J. Vac. Sci, Technol. B, vol. 13, No. 2, Mar./Apr. 1995, pp. 183-191.

Holber, W.M., et al. "Copper deposition by electron cyclotron resonance plasma," J. Vac. Sci. Technol. A 11(6), Nov./Dec. 1993, pp. 2903-2909.

Homma, Y., et al. "Planar deposition of aluminum by RF/DC sputtering with RF bias," J. Electrochem. Soc. vol. 132, No. 6, Jun. 1985; pp. 1466-1472.

Ivanov, I., et al. "Electron energy distribution function in a DC magnetron sputtering discharge," Vacuum, vol. 43, No. 8, 1992, pp. 837-84,.

Kidd, P. "A magnetically confined and electron cyclotron resonance heated plasma machine for coating and ion surface modification use," J. Vac. Sci. Technol. A, vol. 9, No. 3, May/Jun. 1991, pp. 466-473.

Kitamoto, Y., et al. "Compact sputtering apparatus for depositing Co-Cr alloy thin films in magnetic disks," Proc. Of the 4$^{th}$ ISSP (Kanazawa, 1997), pp. 518-522.

Klawuhn, E., et al. "Ionized physical-vapor deposition using a hollow-cathode magnetron source for advanced metallization," J. Vac. Sci. Technol. A 18($), Jul./Aug. 2000, pp. 1546-1549.

Kochel, L.J. "Pressure control of RF bias for sputtering," Rev. Sci. Instrum., vol. 47, No. 12, Dec. 1976, pp. 1556-1557.

Koenig, H., et al. "RF sputtering system with variable substrate bias," IBM Techn. Discl. Bulletin vol. 13, No. 2 (Jul. 1970), pp. 323-324.

Kotani, H., et al. "Sputter-etching planarization for multilevel metallization," J. Electrochem. Soc.: Solid-State Science and Technology, vol. 130, No. 3., Mar. 1983, pp. 645-648.

Matsuo, S. "Reactive ion-beam etching and plasma deposition techniques using electron cyclotron resonance plasmas," Academic Press, Inc., 1983, pp. 76-117.

Matsuoka, M., et al. "Dense plasma production and film deposition by new high-rate sputtering using an electric mirror," J. Vac. Sci. Technol. A, vol. 7, No. 4, Jul./Aug. 1989, pp. 2652-2657.

Musil, J., et al., "Unbalanced magnetrons and new sputtering systems with enhanced plasma ionization," J. Vac. Sci. Technol. A, vol. 9 No. 3, May/Jun. 1991, pp. 1171-1177.

Nender, C., et al. "High bias sputtering for large-area selective deposition," Thin Solid Films 228 (1993) May 15, Nos. 1-2, pp. 87-90.

Park, I.S., et al. "A novel Al-reflow process using surface modification by the ECR plasma treatment and its application to the 256Mbit DRAM," IEEE 1994, pp. 109-112.

Rossnagel, S.M. "Collimated magnetron sputter deposition with grazing angle ion bombardment," J. Vac. Sci. Technol. A 13(1), Jan./Feb. 1995, pp. 156-158.

Samukawa, S., "Wave propagation and plasma uniformity in an electron cyclotron resonance plasma," J. Vac. Sci. Technol. A 11(5), Sep./Oct. 1993, pp. 2572-2576.

Skelly, D. W., et al. "Significant improvement in step coverage using bias sputtered aluminum," J. Vac. Sci. Technol. A 4(3), May/Jun. 1986, pp. 457-460.

Suzuki, K., et al. "Microwave plasma etching," unknown pub., vol. 34, No. 10, 1984, pp. 953-957.

Suzuki, K., et al. "Microwave plasma etching," Japanese J. Applied Physics, vol. 16, No. 11, Nov. 1977, pp. 1979-1984.

Wada, J., et al. "Cu dual damascene process fo 0.13 μm technology generation using self ion sputtering (SIS) with ion reflector," IEEE 2000, pp. 108-110.

Yamashita, M. "Fundamental characteristics of built-in high-frequency coil-type sputtering apparatus," J. Vac. Sci. Technol. A, vol. 7, No. 2, Mar./Apr. 1989, pp. 151-158.

Yasul, T., et al. "Electron cyclotron resonance plasma generation using a planar ring-cusp magnetic field and a reentrant coaxial cavity," J. Vac. Sci. Technol. A 13(4), Jul./Aug. 1995, pp. 2105-2109.

Yamazato, M., et al. "Preparation of TiN thin films by facing targets magnetron sputtering," Proc. Of the 4$^{th}$ ISSP (Kanazawa, 1997), pp. 634-638.

Anon. "Endpoint detection method for ion etching of material having a titanium nitride underlayer," Research Disclosure, Feb. 1991, No. 322, 1 pg.

Novellus Systems, Inc. "Damascus: 12 Steps of Damascus," webpages printed 1998, 14 pp.

"SypherLine by MTi," advertisement, Semiconductor International, Nov. 1985; 4 pp.

"Applications Note, MTi," Internal and/or marketing document, vol. 1, No. 1, Apr. 1986, 4 pp.

First Office Action for Chinese Application No. 02827101.7, mailed on Oct. 20, 2006, 6 pp.

First Office Action for Chinese Application No. 02828203.5, mailed on Jan. 12, 2007, 7 pp.

First Office Action for U.S. Appl. No. 11/184,615, mailed on May 15, 2007, 19 pp.

11184431 Office Action dated Sep. 7, 2007.

CN02827101.7 Office Action dated Jul. 27, 2007.

EPO NPL Document No. XP-002223600, May 11, 2000, 1 pp.

Final Office Action, Jan. 31, 2008, for U.S. Appl. No. 11/184,615, 12 pp.

First Office Action, Oct. 9, 2007, for U.S. Appl. No. 11/184,404, 25 pp.

First Office Action, Oct. 31, 2006, for U.S. Appl. No. 11/185,214, 8 pp.

First Office Action, May 12, 2006, for U.S. Appl. No. 11/185,248, 13 pp.

Machine Translation of JP10152774, dated Jun. 9, 1998, 14 pp.

* cited by examiner

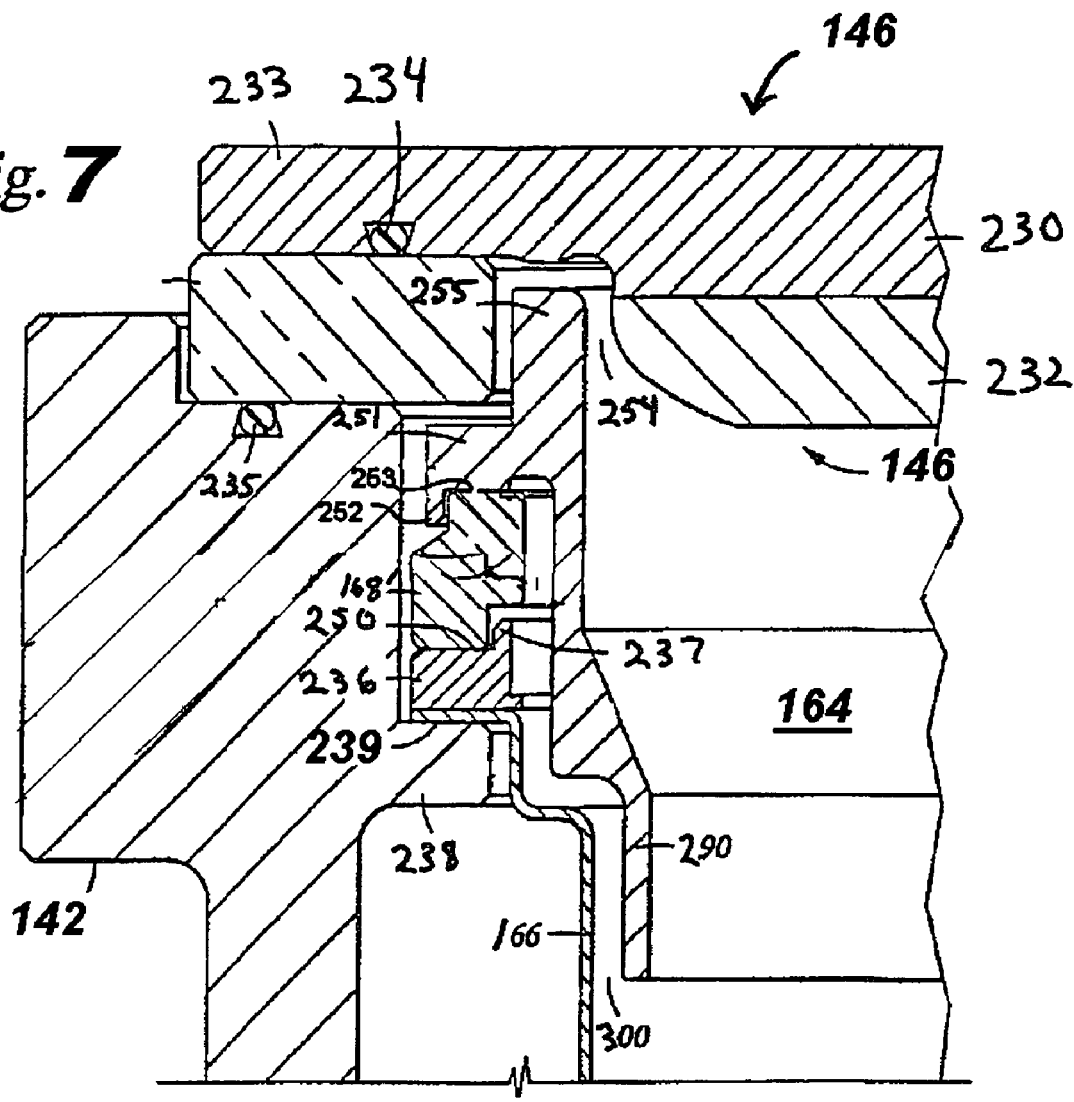

SELF-IONIZED AND CAPACITIVELY-COUPLED PLASMA FOR SPUTTERING AND RESPUTTERING

RELATED APPLICATIONS

This application claims the benefit of the U.S. Provisional Application No. 60/400,097 filed Aug. 1, 2002, which is incorporated by reference in entirety.

FIELD OF THE INVENTION

The inventions relate generally to sputtering and resputtering. In particular, the invention relates to the sputter deposition of material and resputtering of deposited material in the formation of semiconductor integrated circuits.

BACKGROUND ART

Semiconductor integrated circuits typically include multiple levels of metallization to provide electrical connections between large numbers of active semiconductor devices. Advanced integrated circuits, particularly those for microprocessors, may include five or more metallization levels. In the past, aluminum has been the favored metallization, but copper has been developed as a metallization for advanced integrated circuits.

A typical metallization level is illustrated in the cross-sectional view of FIG. 1. A lower-level layer 110 includes a conductive feature 112. If the lower-level layer 110 is a lower-level dielectric layer, such as silica or other insulating material, the conductive feature 112 may be a lower-level copper metallization, and the vertical portion of the upper-level metallization formed in a hole is referred to as a via since it interconnects two levels of metallization. If the lower-level layer 110 is a silicon layer, the conductive feature 112 may be a doped silicon region, and the vertical portion of the upper-level metallization is referred to as a contact because it electrically contacts silicon. An upper-level dielectric layer 114 is deposited over the lower-level dielectric layer 110 and the lower-level metallization 112. There are yet other shapes for the holes including lines and trenches. Also, in dual damascene and similar interconnect structures, as described below, the holes have a complex shape. In some applications, the hole may not extend through the dielectric layer. The following discussion will refer only to via holes, but in most circumstances the discussion applies equally well to other types of holes with only a few modifications well known in the art.

Conventionally, the dielectric layer is silicon oxide formed by plasma-enhanced chemical vapor deposition (PECVD) using tetraethylorthosilicate (TEOS) as the precursor. However, low-k materials of other compositions and deposition techniques are being considered. Some of the low-k dielectrics being developed can be characterized as silicates, such as fluorinated silicate glasses. Hereafter, only silicate (oxide) dielectrics will be directly described, but it is contemplated that other dielectric compositions may be used.

A via hole is etched into the upper-level dielectric layer 114 typically using, in the case of silicate dielectrics, a fluorine-based plasma etching process. In advanced integrated circuits, the via holes may have widths as low as 0.18 µm or even less. The thickness of the dielectric layer 114 is usually at least 0.7 µm, and sometimes twice this, so that the aspect ratio of the hole may be 4:1 or greater. Aspect ratios of 6:1 and greater are being proposed. Furthermore, in most circumstances, the via hole should have a vertical profile.

A liner layer 116 may be deposited onto the bottom and sides of the hole and above the dielectric layer 114. The liner 116 can perform several functions. It can act as an adhesion layer between the dielectric and the metal since metal films tend to peel from oxides. It can also act as a barrier against inter-diffusion between the oxide-based dielectric and the metal. It may also act as a seed and nucleation layer to promote the uniform adhesion and growth and possibly low-temperature reflow for the deposition of metal filling the hole and to nucleate the even growth of a separate seed layer. One or more liner layers may be deposited, in which one layer may function primarily as a barrier layer and others may function primarily as adhesion, seed or nucleation layers.

An interconnect layer 118 of a conductive metal such as copper, for example, is then deposited over the liner layer 116 to fill the hole and to cover the top of the dielectric layer 114. Conventional aluminum metallizations are patterned into horizontal interconnects by selective etching of the planar portion of the metal layer 118. However, a preferred technique for copper metallization, called dual damascene, forms the hole in the dielectric layer 114 into two connected portions, the first being narrow vias through the bottom portion of the dielectric and the second being wider trenches in the surface portion which interconnect the vias. After the metal deposition, chemical mechanical polishing (CMP) is performed which removes the relatively soft copper exposed above the dielectric oxide but which stops on the harder oxide. As a result, multiple copper-filled trenches of the upper level, similar to the conductive feature 112 of the next lower level, are isolated from each other. The copper-filled trenches act as horizontal interconnects between the copper-filled vias. The combination of dual damascene and CMP eliminates the need to etch copper. Several layer structures and etching sequences have been developed for dual damascene, and other metallization structures have similar fabrication requirements.

Lining and filling via holes and similar high aspect-ratio structures, such as occur in dual damascene, have presented a continuing challenge as their aspect ratios continue to increase. Aspect ratios of 4:1 are common and the value will further increase. An aspect ratio as used herein is defined as the ratio of the depth of the hole to narrowest width of the hole, usually near its top surface. Via widths of 0.18 µm are also common and the value will further decrease. For advanced copper interconnects formed in oxide dielectrics, the formation of the barrier layer tends to be distinctly separate from the nucleation and seed layer. The diffusion barrier may be formed from a bilayer of Ta/TaN, W/WN, or Ti/TiN, or of other structures. Barrier thicknesses of 10 to 50 nm are typical. For copper interconnects, it has been found useful to deposit one or more copper layers to fulfill the nucleation and seed functions.

The deposition of the liner layer or the metallization by conventional physical vapor deposition (PVD), also called sputtering, is relatively fast. A DC magnetron sputtering reactor has a target which is composed of the metal to be sputter deposited and which is powered by a DC electrical source. The magnetron is scanned about the back of the target and projects its magnetic field into the portion of the reactor adjacent the target to increase the plasma density there to thereby increase the sputtering rate. However, conventional DC sputtering (which will be referred to as PVD in contrast to other types of sputtering to be introduced) predominantly sputters neutral atoms. The typical ion densities in PVD are often less than $10^9$ cm$^{-3}$. PVD also tends to sputter atoms into a wide angular distribution, typically having a cosine dependence about the target normal. Such a wide distribution can be disadvantageous for filling a deep and narrow via hole 122 such as that illustrated in FIG. 2, in which a barrier layer 124 has already been deposited. The large number of off-angle sputter particles can cause a layer 126 to preferentially deposit around the upper corners of the hole 122 and form overhangs 128. Large overhangs can further restrict entry into the hole 122 and cause inadequate coverage of the sidewalls 130 and bottom 132 of the hole 122. Also, the overhangs 128 can bridge the hole 122 before it is filled and create a void 134 in the metallization within the hole 122. Once a void 134 has formed, it is often difficult to reflow it out by heating the metallization to near its melting point. Even a small void can introduce reliability problems. If a second metallization deposition step is planned, such as by electroplating, the bridged overhangs make subsequent deposition more difficult.

One approach to ameliorate the overhang problem is long-throw sputtering in which the sputtering target is spaced relatively far from the wafer or other substrate being sputter coated. For example, the target-to-wafer spacing can be at least 50% of wafer diameter, preferably more than 90%, and more preferably more than 140%. As a result, the off-angle portion of the sputtering distribution is preferentially directed to the chamber walls, but the central-angle portion remains directed substantially to the wafer. The truncated angular distribution can cause a higher fraction of the sputter particles to be directed deeply into the hole 122 and reduce the extent of the overhangs 128. A similar effect can be accomplished by positioning a collimator between the target and wafer. Because the collimator has a large number of holes of high aspect ratio, the off-angle sputter particles tend to strike the sidewalls of the collimator, and the central-angle particles tend to pass through. Both long-throw targets and collimators typically reduce the flux of sputter particles reaching the wafer and thus tend to reduce the sputter deposition rate. The reduction can become more pronounced as throws are lengthened or as collimation is tightened to accommodate via holes of increasing aspect ratios.

The efficiency of long-throw sputtering typically decreases as target-to-wafer spacing increases. At the few milliTorr of argon pressure often used in PVD sputtering, there is a greater possibility of the argon scattering the sputtered particles as the target-to-wafer spacing increases. Hence, the geometric selection of the forward particles may be decreased. A yet further problem with both long throw and collimation is that the reduced metal flux can result in a longer deposition period which can not only reduce throughput, but also tends to increase the maximum temperature the wafer experiences during sputtering. Still further, long-throw sputtering can reduce overhangs and provide good coverage in the middle and upper portions of the sidewalls, but the lower sidewall and bottom coverage can be less than satisfactory.

Another technique for deep hole lining and filling is sputtering using a high-density plasma (HDP) in a sputtering process called ionized metal plating (IMP). A typical high-density plasma is one having an average plasma density across the plasma, exclusive of the plasma sheaths, of at least $10^{11}$ cm$^{-3}$, and preferably at least $10^{12}$ cm$^{-3}$. In IMP deposition, a separate plasma source region is formed in a region away from the wafer, for example, by inductively coupling RF power into a plasma from an electrical coil wrapped around a plasma source region between the target and the wafer. The plasma generated in this fashion is referred to as an inductively coupled plasma (ICP). An HDP chamber having this configuration is commercially available from Applied Materials of Santa Clara, Calif. as the HDP PVD Reactor. Other HDP sputter reactors are available. The higher power ionizes not only the argon working gas, but also significantly increases the ionization fraction of the sputtered atoms, that is, metal ions. The wafer either self-charges to a negative potential or is RF biased to control its DC potential. The metal ions are accelerated across the plasma sheath as they approach the negatively biased wafer. As a result, their angular distribution becomes strongly peaked in the forward direction so that they are drawn deeply into the via hole. Overhangs become much less of a problem in IMP sputtering, and bottom coverage and bottom sidewall coverage are relatively high.

IMP sputtering using a remote plasma source is usually performed at a higher pressure such as 30 milliTorr or higher. The higher pressures and a high-density plasma can produce a very large number of argon ions, which are also accelerated across the plasma sheath to the surface being sputter deposited. The argon ion energy is often dissipated as heat directly into the film being formed. Copper can dewet from tantalum nitride and other barrier materials at the elevated temperatures experienced in IMP, even at temperatures as low at 50 to 75 C. Further, the argon tends to become embedded in the developing film. IMP can deposit a copper film as illustrated at 136 in the cross-sectional view of FIG. 3, having a rough or discontinuous surface morphology. Such a film may not promote hole filling, particularly when the liner is being used as the electrode for electroplating.

Plasmas may also be generated by capacitive coupling. In such chambers, RF energy may be capacitively coupled into the chamber through parallel electrodes such as the wafer pedestal and the target. However, capacitively coupled plasmas (CCP) tend to have a density substantially less than that often achieved by ICP plasmas. Hence, the ionization rate of CCP plasmas is often less than that of ICP plasmas.

Another technique for depositing metals is sustained self-sputtering (SSS), as described by Fu et al. in U.S. Pat. No. 6,692,617 issued Feb. 17, 2004 and by Fu in U.S. Pat. No. 6,183,614 B1 issued Feb. 6, 2001. For example, at a sufficiently high plasma density adjacent a copper target, a sufficiently high density of copper ions develops that the copper ions will resputter the copper target with yield over unity. The supply of argon working gas can then be eliminated or at least reduced to a very low pressure while the copper plasma persists. Aluminum is believed to be not readily susceptible to SSS. Some other materials, such as Pd, Pt, Ag, and Au can also undergo SSS.

Depositing copper or other metals by sustained self-sputtering of copper has a number of advantages. The sputtering rate in SSS tends to be high. There is a high fraction of copper ions which can be accelerated across the plasma sheath and toward a biased wafer, thus increasing the directionality of the sputter flux. Chamber pressures may be made very low, often limited by leakage of backside cooling gas, thereby reducing wafer heating from the argon ions and decreasing scattering of metal particles by the argon.

Techniques and reactor structures have been developed to promote sustained self-sputtering. It has been observed that some sputter materials not subject to SSS because of sub-unity resputter yields nonetheless benefit from these same techniques and structures, presumably because of partial self-sputtering, which results in a partial self-ionized plasma (SIP). Furthermore, it is often advantageous to sputter copper with a low but finite argon pressure even though SSS without any argon working gas is achievable. Hence, SIP sputtering is the preferred terminology for the more generic sputtering process involving a reduced or zero pressure of working gas so that SSS is a type of SIP.

Metal may also be deposited by chemical vapor deposition (CVD) using metallo-organic precursors, such as Cu-HFAC-VTMS, commercially available from Schumacher in a proprietary blend with additional additives under the trade name CupraSelect. A thermal CVD process may be used with this precursor, as is very well known in the art, but plasma enhanced CVD (PECVD) is also possible. The CVD process is capable of depositing a generally uniform film even in high-aspect-ratio holes. A film may be deposited by CVD as a thin seed layer, and then PVD or other techniques may be used for final hole filling. However, CVD copper seed layers have often been observed to be rough. The roughness can detract from its use as a seed layer and more particularly as a reflow layer promoting the low temperature reflow of after deposited copper deep into the hole. Also, the roughness indicates that a relatively thick CVD copper layer of the order of 50 nm may be needed to reliably coat a continuous seed layer. For the narrower via holes now being considered, a CVD copper seed layer of a certain thickness may nearly fill the hole. Moreover, complete fills performed by CVD can exhibit center seams, which may affect device reliability.

Another combination technique uses IMP sputtering to deposit a thin copper nucleation layer, sometimes referred to as a flash deposition, and a thicker CVD copper seed layer is deposited on the IMP layer. However, as illustrated in FIG. 3, the IMP layer 136 can be rough, and the CVD layer tends to conform to the roughened substrate. Hence, the CVD layer over an IMP layer will also tend to be rough.

Electrochemical plating (ECP) is yet another copper deposition technique that is being developed. In this method, the wafer is immersed in a copper electrolytic bath. The wafer is electrically biased with respect to the bath, and copper electrochemically deposits on the wafer in a generally uniform film. Electroless plating techniques are also available. Electroplating and its related processes are advantageous because they can be performed with simple equipment at atmospheric pressure, the deposition rates are high, and the liquid processing is compatible with the subsequent chemical mechanical polishing. Also, the electroplating electrode primarily operates on the entire hole sidewalls so that high sidewall coverage is achieved.

Electroplating, however, imposes its own requirements. A seed and adhesion layer is usually provided on top of the barrier layer, such as of Ta/TaN, to nucleate the electroplated copper and adhere it to the barrier material. Furthermore, the generally insulating structure surrounding the via hole 122 requires that an electroplating electrode be formed between the dielectric layer 114 and the via hole 122. Tantalum and other barrier materials are typically relatively poor electrical conductors, and the usual nitride sublayer of the barrier layer 124 which faces the via hole 122 (containing the copper electrolyte) is even less conductive for the long transverse current paths needed in electroplating. Hence, a good conductive seed and adhesion layer are often deposited to facilitate the electroplating effectively filling the bottom of the via hole.

A copper seed layer deposited over the barrier layer 124 is typically used as the electroplating electrode. However, a continuous, smooth, and uniform film is preferred. Otherwise, the electroplating current will be directed only to the areas covered with copper or be preferentially directed to areas covered with ticker copper. Depositing the copper seed layer presents its own difficulties. An IMP deposited seed layer provides good bottom coverage in high aspect-ratio holes, but its sidewall coverage can be small such that the resulting thin films can be rough or discontinuous. A thin CVD seed layer can also be too rough. A thicker CVD seed layer, or CVD copper over IMP copper, may require an excessively thick seed layer to achieve the required continuity.

SUMMARIES OF ILLUSTRATIVE EMBODIMENTS

One embodiment of the present inventions is directed to sputter depositing a liner material such as tantalum or tantalum nitride, by combining long-throw sputtering, self-ionized plasma (SIP) sputtering and capacitively-coupled plasma (CCP) resputtering in one chamber. In a preferred embodiment, a magnetic field generated by an electromagnetic coil confines the plasma generated by capacitive coupling to increase the plasma density and hence the ionization rate. Long-throw sputtering is characterized by a relatively high ratio of the target-to-substrate distance to the substrate diameter. Long-throw SIP sputtering promotes deep hole coating of both the ionized and neutral deposition material components. CCP resputtering can reduce the thickness of layer bottom coverage of deep holes to reduce contact resistance.

SIP tends to be promoted by low pressures of less than 5 milliTorr. SIP, particularly at these low pressures, tends to be promoted by magnetrons having relatively small areas causing increased target power density, and by magnetrons having asymmetric magnets causing the magnetic field to penetrate farther toward the substrate. CCP resputtering may be enhanced by providing one or more electromagnets around a plasma generation area between electrodes which capacitively generate the plasma. RF energy is capacitively coupled into the area by the electrodes to generate and maintain a plasma. According to one aspect of the invention, plasma conditions alternate between SIP sputtering to deposit target material and CCP resputtering to thin or eliminate portions of the deposited layer.

There are additional aspects to the present inventions as discussed below. It should therefore be understood that the preceding is merely a brief summary of some embodiments and aspects of the present inventions. Additional embodiments and aspects of the present inventions are referenced below. It should further be understood that numerous changes to the disclosed embodiments can be made without departing from the spirit or scope of the inventions. The preceding summary therefore is not meant to limit the scope of the inventions. Rather, the scope of the inventions is to be determined only by the appended claims and their equivalents.

BRIEF DESCRIPTION OF THE DRAWINGS

FIG. 7 is an enlarged view of a portion of the chamber of FIG. 4 adjacent the target support and chamber body seals.

DESCRIPTIONS OF ILLUSTRATIVE EMBODIMENTS

Figure 1:
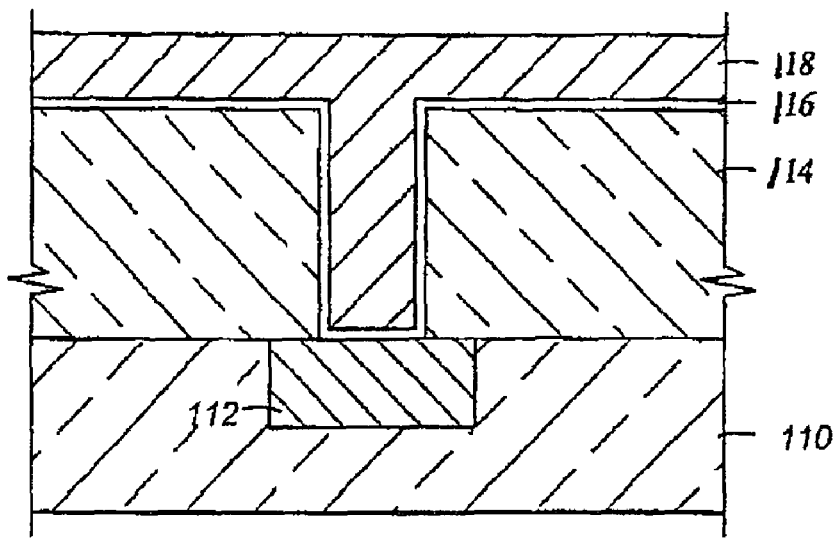
FIG. 1 is a cross-sectional view of a via filled with a metallization, which also covers the top of the dielectric, as practiced in the prior art.

The distribution between sidewall and bottom coverage in a DC magnetron sputtering reactor can be tailored to produce a metal layer, such as a liner layer, having a desired profile in a hole or via in a dielectric layer. An SIP film sputter deposited into a high-aspect ratio via can have favorable upper sidewall coverage and tends not to develop overhangs. Where desired, bottom coverage may be thinned or eliminated by CCP resputtering of the bottom of the via. In accordance with one aspect of the present inventions, the advantages of both types of sputtering can be obtained in a reactor which combines selected aspects of both SIP and CCP plasma generation techniques, which can be in separate steps in one embodiment. In addition, a magnetic field can be applied to confine the CCP plasma to enhance resputtering. An example of such a reactor is illustrated generally at 140 in FIG. 4.

The reactor 140 of the illustrated embodiment is a DC magnetron type reactor based on a modification of the Endura PVD Reactor available from Applied Materials, Inc. of Santa Clara, Calif. The illustrated reactor 140 is capable of self-ionized sputtering (SIP) in a long-throw mode. This SIP mode may be used in one embodiment in which nonuniform coverage is desired, such as coverage primarily directed to the sidewalls of the hole. The SIP mode may be used to achieve more uniform coverage also.

The reactor 140 includes a vacuum chamber 142, usually of metal and electrically grounded, sealed through a target isolator 144 to a PVD target 146 having at least a surface portion composed of the material to be sputter deposited on a wafer 148. The wafer may be different sizes including 150, 200, 300 and 450 mm. The wafer, also referred to as a workpiece or substrate, may be composed of silicon, glass, or other materials.

The wafer 148 is supported by a support surface of an RF pedestal electrode 152 which capacitively couples RF energy into the interior of the reactor. The target 146 provides a second electrode facing the pedestal electrode 152 for capacitive coupling. The RF energy provided by the pedestal 152 ionizes a precursor gas such as argon to maintain a plasma in the area 154 between the electrodes to resputter a deposition layer using ionized argon to thin bottom coverage, or to ionize sputtered deposition material to improve bottom coverage, or both.

In one aspect of the illustrated embodiments, the chamber 142 has one or more electromagnets 156 disposed around the RF pedestal 152 and the area 154 between the RF pedestal 152 and the target 146. The magnets 156 generate a magnetic field which acts to confine the CCP plasma generated by the RF pedestal electrode 152. As a consequence, it is believed that resputtering may be enhanced.

In one embodiment, rather than maintain the plasma at a relatively high pressure, such as 20–60 mTorr typical for high density IMP processes, the pressure is preferably maintained at pressures below 5 mTorr, including 1 mTorr for deposition of tantalum nitride or 2.5 mTorr for deposition of tantalum, for example. However, pressures in the range of 0.1 to 40 mTorr may be appropriate, depending upon the application. As a consequence, it is believed that the ionization rate within the reactor 140 will be substantially lower than that of the typical high density IMP process. This plasma may be used to ionize sputtered deposition material or to resputter a deposited layer, or both.

In one embodiment, it is believed that good upper sidewall coverage and bottom corner coverage can be achieved in a multi-step process in which relatively little RF power is applied to the pedestal 152. Thus, in one step, ionization of the sputtered target deposition material would occur primarily as a result of the self-ionization. Consequently, it is believed that good upper sidewall coverage may be achieved. In a second step and preferably in the same chamber, a relatively large amount of RF power may be applied to the pedestal electrode 152 while low or no power is applied to the target. In this embodiment, little or no material would be sputtered from the target 146 while ionization of a precursor gas would occur primarily as a result of the RF energy capacitively coupled by the pedestal 152. The CCP plasma, enhanced by the magnetic field generated by the electromagnet 156, may be directed to thin or eliminate bottom coverage by etching or resputtering to reduce barrier layer resistance at the bottom of the hole.

The CCP plasma may be maintained at a pressure appropriate for the particular process. Suitable pressure ranges include 1–30 or 1–10 or 1–5 mTorr and suitable values include 5 or 2 mTorr with a pressure value of 2 mTorr being a preferred value for the resputtering portion of the illustrated embodiment.

In an alternative embodiment, ionization of deposition material may be enhanced during SIP sputtering of the target 146. More specifically, the electromagnets 156 may be activated to generate a magnetic field to confine the SIP generated plasma. In addition, RF power may be applied to the pedestal electrode 152 to supplement the SIP plasma with CCP plasma. It is believed that the combined SIP and CCP ionization processes can provide sufficient ionized material for both bottom and bottom corner coverage. Moreover, it is believed that the lower ionization rate of the low pressure plasma provided by the RF pedestal 152 can provide sufficient remaining neutral material for upper sidewall coverage as well.

In yet another alternative embodiment, the pressure in the chamber may be changed from one step to the next. For example, pressure may be raised during SIP sputtering or CCP resputtering or both, to change plasma uniformity or ionization rate as appropriate for the particular application.

A wafer clamp 160 holds the wafer 148 on the pedestal electrode 152. Resistive heaters, refrigerant channels, and a thermal transfer gas cavity in the pedestal 152 can be provided to allow the temperature of the pedestal to be controlled to temperatures of less than −40° C., thereby allowing the wafer temperature to be similarly controlled.

A darkspace shield 164 and a chamber shield 166 separated by a second dielectric shield isolator 168 are held within the chamber 142 to protect the chamber wall 142 from the sputtered material. In the illustrated embodiment, the darkspace shield 164 is permitted to float electrically and the chamber shield 166 is electrically grounded. However, in some embodiments, shields may be both grounded or biased to the same or different nonground levels. The chamber shield 166 can also act as an anode grounding plane in opposition to the cathode target 146 and the RF pedestal electrode 152, thereby capacitively supporting a plasma. If the darkspace shield is permitted to float electrically, some electrons can deposit on the darkspace shield 164 such that a negative charge builds up there. It is believed that the negative potential could not only repel further electrons from being deposited, but also confine the electrons in the main plasma area, thus reducing the electron loss, sustaining low-pressure sputtering, and increasing the plasma density, if desired.

To enable use of the pedestal as a source of plasma energy, RF power is passed through the vacuum chamber walls to the pedestal 152. Vacuum feedthroughs (not shown) extend through the vacuum chamber wall to provide RF current from a generator preferably located outside the vacuum pressure chamber.

The plasma darkspace shield 164 is generally cylindrically-shaped. The plasma chamber shield 166 is generally bowl-shaped and includes a generally cylindrically shaped, vertically oriented wall 170. The electromagnets 156 include a first coil 172 and a second coil 174, each of which is wound around the exterior of the shield 166. The coils 172 and 174 are supported by an adaptor 176 carried by the shield 166. Vacuum feedthroughs extend through the vacuum chamber wall to provide current to the coils 172 and 174 from one or more sources preferably located outside the vacuum pressure chamber.

Figure 5:
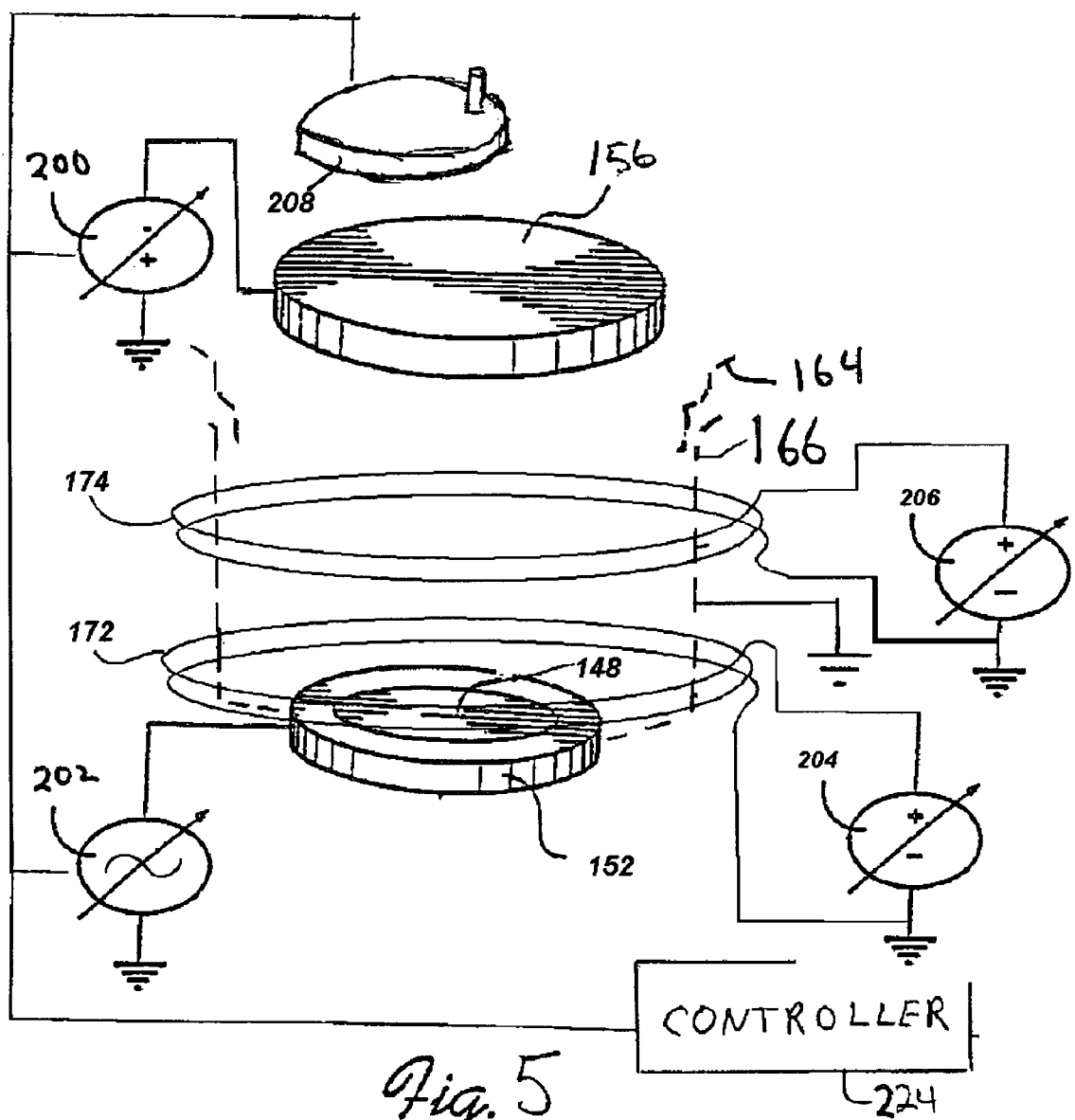
FIG. 5 is a schematic representation of electrical interconnections of various components of the sputtering chamber of FIG. 4.

FIG. 5 is a schematic representation of the electrical connections of the plasma generating apparatus of the illustrated embodiment. To attract the ions generated by the plasma, the target 146 is preferably negatively biased by a variable DC power source 200 at a DC power of 1–40 kW, for example. The source 200 negatively biases the target 146 to about −400 to −600 VDC with respect to the chamber shield 166 to ignite and maintain the plasma. A voltage less than −1000 VDC is generally suitable for many applications. A target power of between 1 and 5 kW is typically used to ignite the plasma while a power of greater than 10 kW is preferred for the SIP sputtering described here. For example, a target power of 24 kW may be used to deposit tantalum nitride by SIP sputtering and a target power of 20 kW may be used to deposit tantalum by SIP sputtering.

During CCP resputtering the target voltage may be reduced to a low level such as 0 volts, for example, and power may be reduced to 100–200 watts, for example, to facilitate plasma uniformity. Alternatively, the target voltage may be maintained at a high level (0–500 or 0–1000 VDC, for example) if target sputtering during CCP resputtering is desired, or may be turned off entirely, if desired.

A source 202 applies RF power to the pedestal electrode 152 to bias the wafer 148 to attract deposition material ions during SIP sputter deposition. In addition, the source 202 applies RF power to the pedestal electrode 152 to strike a plasma for CCP resputtering and also to bias the wafer 148 to attract argon ions during CCP resputtering. During SIP deposition, the pedestal 152 and hence the wafer 148 may be left electrically floating, but a negative DC self-bias may nonetheless develop on it. Alternatively, the pedestal 152 may be negatively biased by a source at −30 VDC to negatively bias the wafer 148 to attract the ionized deposition material to the substrate.

If the source 202 biasing the wafer through the pedestal is an RF power supply, the supply may operate at a frequency of 13.56 MHz, for example. Other frequencies are suitable such as 60 MHz, depending upon the particular application. The pedestal 152 may be supplied with RF power in a range of 10 watts to 5 kW, for example, a more preferred range being 150 to 300 W for a 200 mm wafer in SIP deposition.

During CCP resputtering of the wafer, the RF power applied to the pedestal electrode 152 may operate at the aforementioned frequencies including 13.56 or 60 MHz. The RF power should be sufficient to bias the wafer to attract the etching ions and in addition, strike and maintain a CCP plasma to provide the etching ions.

The above-mentioned power and voltage levels and frequencies may vary of course, depending upon the particular application. A computer-based controller 224 may be programmed to control the power levels, voltages, currents and frequencies of the various sources in accordance with the particular application.

Figure 6:
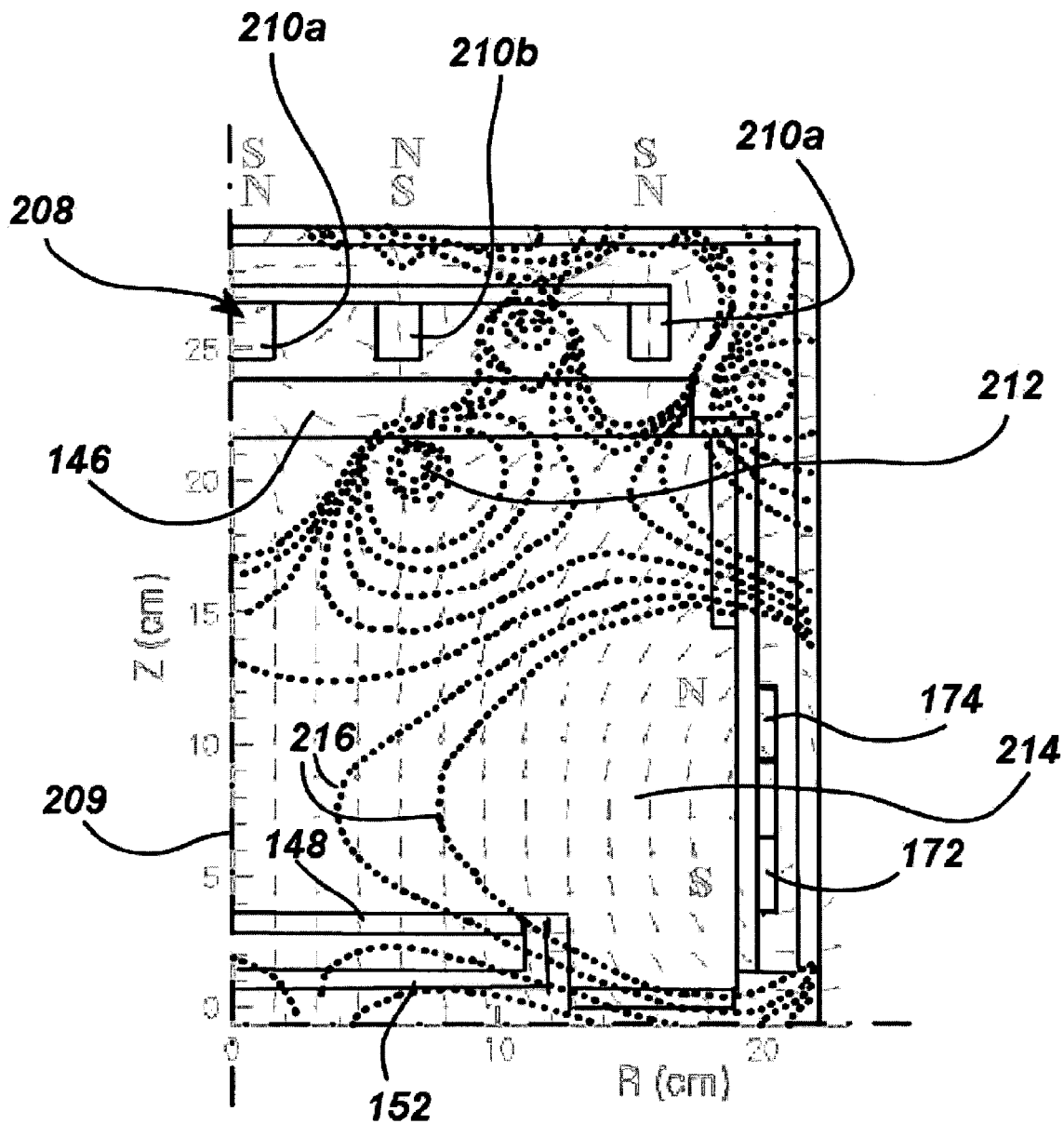
FIG. 6 is a graph depicting a computer simulation of the resultant magnetic fields in one embodiment of the chamber of FIG. 4.

The electromagnet coils 172 and 174 may be powered by separate sources 204 and 206, respectively, as schematically represented in FIG. 5. Such an arrangement facilitates separate control of the magnitude and polarity of the current applied to the coils 172, 174 to achieve the desired magnetic field. FIG. 6 is a schematic representation of the chamber 140 in which a computer simulation is illustrated of one example of a magnetic field generated by the coils in combination with a magnetron 208 positioned adjacent to the target 146. In the illustrated embodiment, the target 146, wafer 148 and pedestal 152 are coaxially aligned on a central chamber axis 209 along a direction designated Z in FIG. 6. A direction R orthogonal to the axis 209 represents the radial distance from the axis 209.

The magnetic field generated by the coils 172 and 174 influences the magnetic field distributed by the rotating permanent magnets 210a, 210b of the magnetron 208. In the embodiment of FIG. 6, the resultant magnetic field has a null region 212 near the target 146 and a higher field strength in an area 214 near the wafer 148 and the pedestal 152. The changes in the field strength are represented by gradient lines 216 in the computer simulation of FIG. 6. It is believed that a resultant magnetic field as depicted in FIG. 6 tends to confine the CCP plasma generated by the RF energy supplied by the pedestal 152 to increase plasma bulk density adjacent the wafer 148. As a consequence, the ionization of the precursor gas may be increased to enhance the resputtering of the wafer 148. In addition, the resultant magnetic field is believed to influence the distribution of the ion flux to the wafer 148.

The levels and directions of the coils may be selected as appropriate to favorably affect the resultant magnetic field and hence plasma density and ion flux. For example, the currents in coils 172 and 174 may be 10 and −5 A, respectively. In another embodiment, the currents in coils 172 and 174 may be 5 and 0 A, respectively.

In addition to the current levels and polarities, the resultant magnetic field is also influenced by the number and placement of the electromagnetic coils as well as the number of turns in each coil. In the illustrated embodiment, the coils 172 and 174 surround the area 154 between the target 146 and the pedestal 152 and are centered on the central chamber axis 209. The coil 172 is substantially radially aligned with the pedestal 152 in direction R orthogonal to the central axis whereas the coil 174 is radially aligned more closely to the midpoint between the target and pedestal. The specific positioning of the coils will dependent upon the particular application. Similarly, the coil power levels may vary depending upon the particular application. The controller 224 may be programmed to control the power levels, voltages, currents and frequencies of the various sources for the electromagnets as well.

As best seen in FIG. 7, the target 146 includes an aluminum or titanium backing plate 230 to which is soldered or diffusion bonded a target sputtering portion 232 of the metal to be deposited, such as tantalum or copper. A flange 233 of the backing plate 230 rests on and is vacuum sealed through a polymeric target O-ring 234 to the target isolator 144, which is preferably composed of a ceramic such as alumina. The target isolator 144 rests on and is vacuum sealed through an adaptor O-ring 235 to the chamber 142, which in fact may be an aluminum adaptor sealed to the main chamber body.

A metal clamp ring 236 has on its inner radial side an upwardly extending annular rim 237. Bolts or other suitable fasteners fix the metal clamp ring 236 to an inwardly extending ledge 238 of the chamber 142 and capture a flange 239 of the chamber shield 166. Thus, the chamber shield 166 is mechanically and electrically connected to the grounded chamber 142.

The shield isolator 168 freely rests on the clamp ring 236 and may be machined from a ceramic material such as alumina. The lower portion of the shield isolator 168 has an inner annular recess fitting outside of the rim 237 of the clamp ring 236. The rim 237 not only acts to center inner diameter of the shield isolator 168 with respect to the clamp ring 236 but also acts as a barrier against any particles generated at the sliding surface 250 between the ceramic shield isolator 168 and the metal ring clamp 236 from reaching the main processing area.

A flange 251 of the darkspace shield 164 freely rests on the shield isolator 168 and has a tab or rim 252 on its outside extending downwardly into an annular recess formed at the upper outer corner of the shield isolator 168. Thereby, the tab 252 centers the darkspace shield 164 with respect to the target 146 at the outer diameter of the shield isolator 168. The shield tab 252 is separated from the shield isolator 168 by a narrow gap which is sufficiently small to align the plasma dark spaces but sufficiently large to prevent jamming of the shield isolator 168, and the darkspace shield flange 251 rests on the shield isolator 168 in a sliding contact area 253 inside and above the tab 252.

A narrow channel 254 is formed between a head 255 of the darkspace shield 164 and the target 146. It has a width of about 2 mm to act as a plasma dark space. The darkspace shield 164 includes a downwardly extending lower cylindrical portion 290. Similarly, the chamber shield 166 has a narrowed lower cylindrical portion 170 which fits outside of and is thus wider than the darkspace shield lower cylindrical portion 290. A convoluted narrow channel 300 is formed between the darkspace and chamber shields 164, 166 with the offset between the grounded lower cylindrical portion 170 and darkspace upper cylindrical portion 164 assuring no direct line of sight between the two vertical channel portions. A purpose of the channel 300 is to electrically isolate the two shields 164, 166 while protecting the clamp ring 236 and the shield isolator 168 from metal deposition.

The channel 300 is preferably shaped so that any deposition material ions and scattered deposition material atoms penetrating the channel 300 are likely to have to bounce several times from the shields before they can find their way further toward the clamp ring 236 and the shield isolator 168. Any one bounce is likely to result in the ion being absorbed by the shield. Also, the convoluted channel 300 can collect ceramic particles generated from the shield isolator 168 during processing to be pasted by deposition material also collected there.

Returning to the large view of FIG. 4, the lower cylindrical portion 170 of the chamber shield 166 continues downwardly to well below the top of the pedestal 152. The chamber shield 166 then continues radially inward in a bowl portion 302 and vertically upward in an innermost cylindrical portion 151 to approximately the elevation of the wafer 148 but spaced radially outside of the pedestal 152.

The shields 164, 166 are typically composed of stainless steel, and their inner sides may be bead-blasted or otherwise roughened to promote adhesion of the material sputter deposited on them. At some point during prolonged sputtering, however, the deposited material builds up to a thickness that is likely to flake off, producing deleterious particles. Before this point is reached, the shields 164, 166 should be cleaned or replaced. However, the more expensive isolators 144, 168 do not need to be replaced in most maintenance cycles. Thus, the maintenance cycle is determined by flaking of the shields.

As mentioned, the darkspace shield 164, if floating can accumulate some electron charge and build up a negative potential. Thus biased, it repels further electron loss to the darkspace shield 164 and confines the plasma nearer the target 146. Ding et al. have disclosed a similar effect with a somewhat similar structure in U.S. Pat. No. 5,736,021. In selecting an appropriate darkspace shield, it is noted that the darkspace shield 164 electrically shields the chamber shield 166 from the target 146 so that it should not extend too far away from the target 146. If it is too long, it is believed it can become more difficult to strike the plasma; but, if it is too short, it is believed that electron loss can increase such that sustaining the plasma at lower pressure is more difficult and the plasma density may fall. In the illustrated embodiment, the shield 164 has an axial length of 7.6 cm but may range from 6–10 cm in a preferred embodiment.

Referring again to FIG. 4, a gas source 314 supplies a sputtering working gas, typically the chemically inactive noble gas argon, to the chamber 142 through a mass flow controller 316. The working gas can be admitted to the top of the chamber or, as illustrated, at its bottom, either with one or more inlet pipes penetrating apertures through the bottom of the shield chamber shield 166 or through a gap 318 between the chamber shield 166, the wafer clamp 160, and the pedestal 152. A vacuum pump system 320 connected to the chamber 142 through a wide pumping port 322 maintains the chamber at a low pressure. Although the base pressure can be held to about $10^{-7}$ Torr or even lower, the pressure of the working gas is typically maintained between about 1 and 1000 milliTorr in conventional sputtering and below about 5 milliTorr in SIP sputtering. The computer-based controller 224 controls the reactor including the DC target power supply 200

To provide efficient sputtering, the magnetron 208 is positioned in back of the target 146. It has opposed magnets 210$a$, 210$b$ connected and supported by a magnetic yoke 336. The magnets create a magnetic field adjacent the magnetron 208 within the chamber 142. The magnetic field traps electrons and, for charge neutrality, the ion density also increases to form a high-density plasma region 338. The magnetron 208 is usually rotated about the center axis 209 of the target 146 by a motor-driven shaft 342 to achieve full coverage in sputtering of the target 146. To achieve a high-density plasma 338 of sufficient ionization density to allow sustained self-sputtering, the power density delivered to the area adjacent the magnetron 208 is preferably made high. This can be achieved, as described by Fu in the above cited patents, by increasing the power level delivered from the DC power supply 200 and by reducing the area of magnetron 208, for example, in the shape of a triangle or a racetrack. A 60 degree triangular magnetron, which is rotated with its tip approximately coincident with the target center 209, covers only about ⅙ of the target at any time. Coverage of ¼ is the preferred maximum in a commercial reactor capable of SIP sputtering.

To decrease the electron loss, the inner magnetic pole represented by the inner magnet 210$b$ and magnetic pole face should have no significant apertures and be surrounded by a continuous outer magnetic pole represented by the outer magnets 210$a$ and pole face. Furthermore, to guide the ionized sputter particles to the wafer 148, the outer pole should produce a much higher magnetic flux than the inner pole. The extending magnetic field lines trap electrons and thus extend the plasma closer to the wafer 148. The ratio of magnetic fluxes should be at least 150% and preferably greater than 200%. Two embodiments of Fu's triangular magnetron have 25 outer magnets and 6 or 10 inner magnets of the same strength but opposite polarity.

Although the target of the illustrated embodiment is depicted as a planar target, it is appreciated that targets of a variety of shapes may be used. For example, vaulted and cylindrical targets may be utilized.

When the argon is admitted into the chamber, the DC voltage difference between the target 146 and the chamber shield 166 ignites the argon into a plasma, and the positively charged argon ions are attracted to the negatively charged target 146. The ions strike the target 146 at a substantial energy and cause target atoms or atomic clusters to be sputtered from the target 146. Some of the target particles strike the wafer 148 and are thereby deposited on it, thereby forming a film of the target material. In reactive sputtering of a metallic nitride, nitrogen is additionally admitted into the chamber from a source 343, and it reacts with the sputtered metallic atoms to form a metallic nitride on the wafer 148.

Figure 8A:
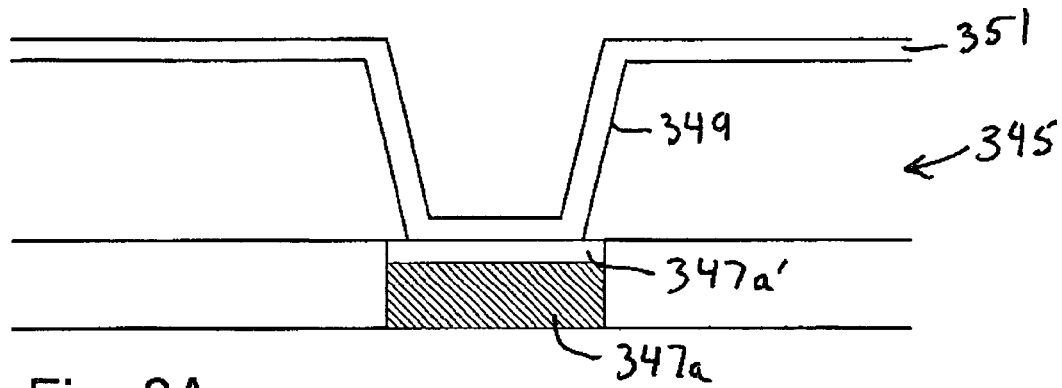
FIGS. 8A–8E are cross-sectional views of a via liner and via liner formation process according to one embodiment of the invention.
Figure 8B:
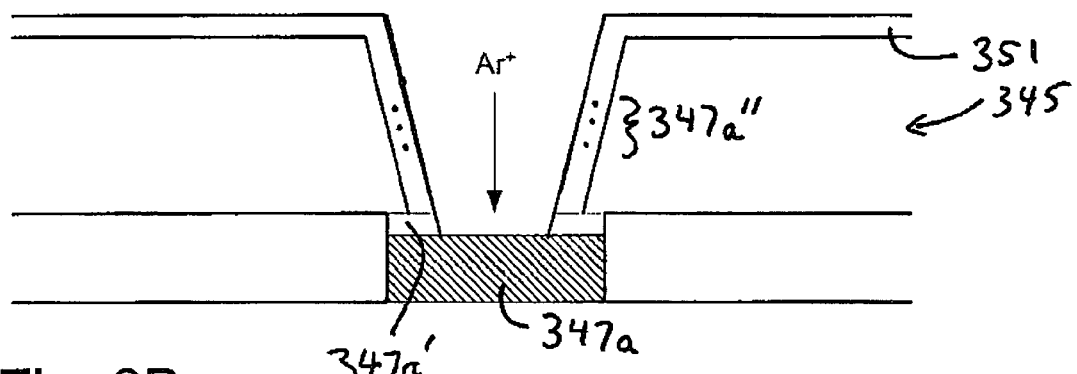
Figure 8C:
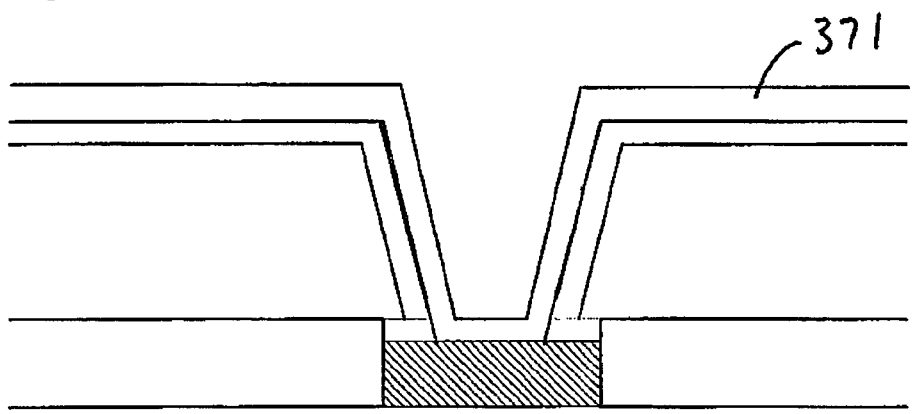
Figure 8D:
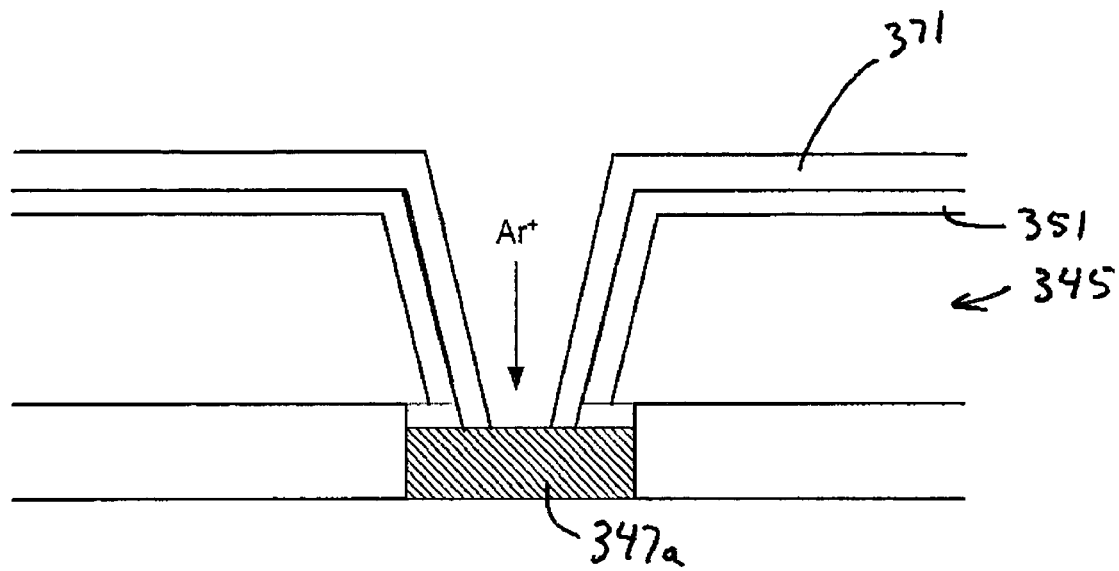
Figure 8E:
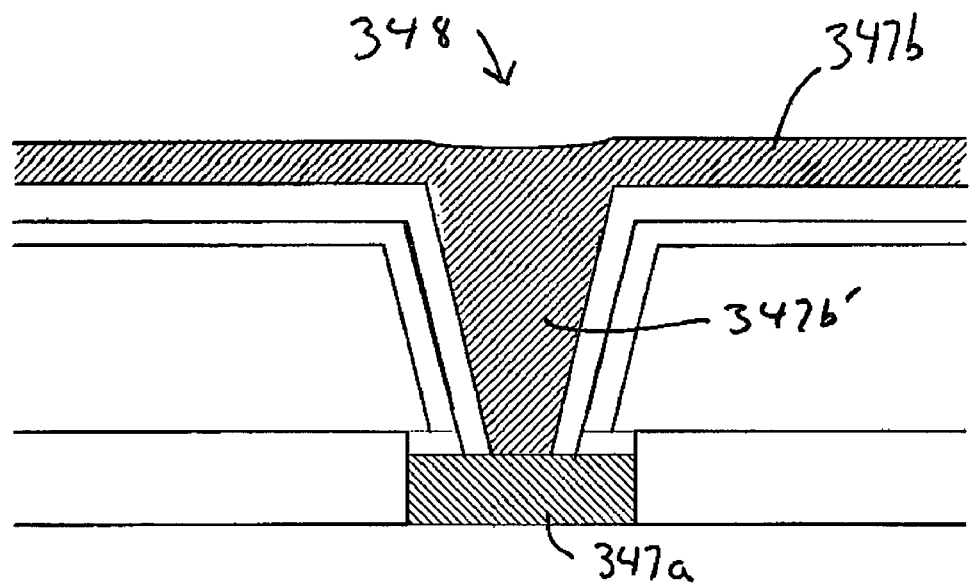

FIGS. 8A–E show sequential cross-sectional views of the formation of liner layers in accordance with a one aspect of the present inventions. With reference to FIG. 8A, an interlayer dielectric 345 (e.g. silicon dioxide) is deposited over a first metal layer (e.g., a first copper layer 347a) of an interconnect 348 (FIG. 8E). A via 349 then is etched in the interlayer dielectric 345 to expose the first copper layer 347a. The first metal layer may be deposited using CVD, PVD, electroplating or other such well known metal deposition techniques, and it is connected, via contacts, through a dielectric layer, to devices formed in the underlying semiconductor wafer. If the first copper layer 347a is exposed to oxygen, such as when the wafer is moved from an etching chamber in which the oxide overlaying the first copper layer is etched to create apertures for creation of vias between the first copper layer and a second to be deposited metal layer, it can readily form an insulating/high resistance copper oxide layer 347a' thereon. Accordingly, to reduce the resistance of the copper interconnect 348, any copper oxide layer 347a' and any processing residue within the via 349 may be removed.

Figure 2:
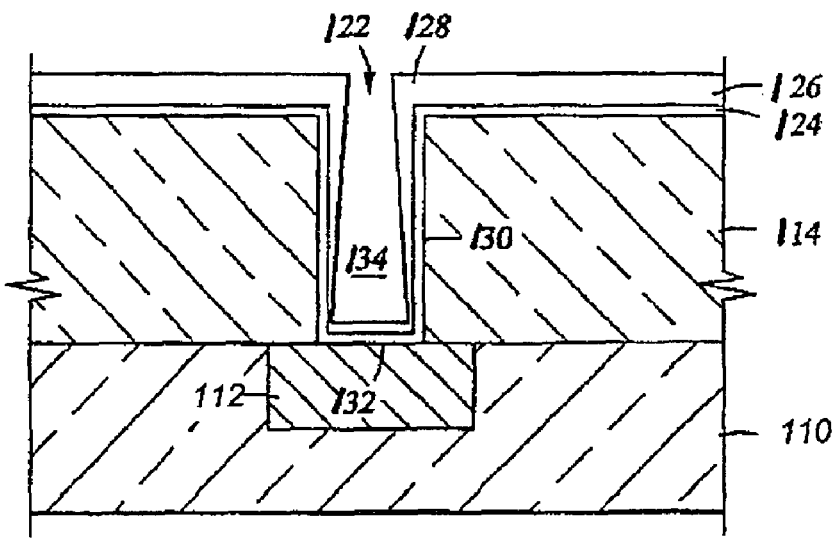
FIG. 2 is a cross-sectional view of a via during its filling with metallization, which overhangs and closes off the via hole.
Figure 3:
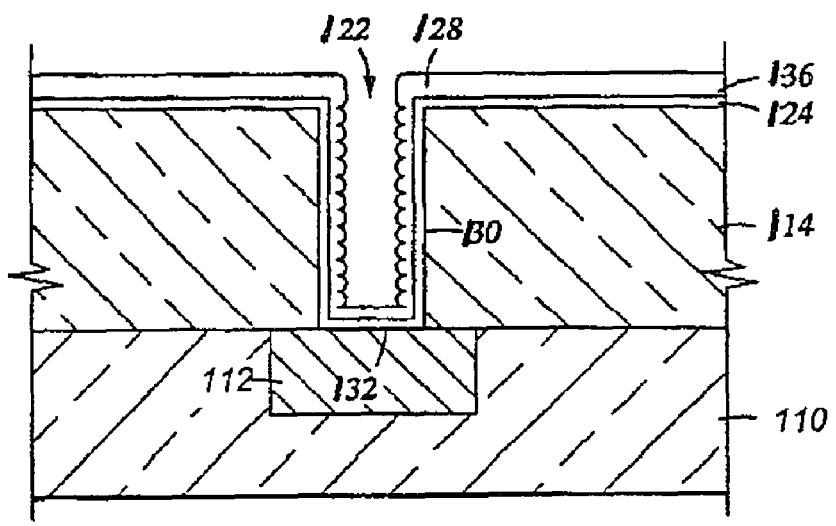
FIG. 3 is a cross-sectional view of a via having a rough seed layer deposited by ionized metal plating.

A barrier layer 351 may be deposited (e.g., within the sputtering chamber 142 of FIG. 2) over the interlayer dielectric 345 and over the exposed first copper layer 347a prior to removing the copper oxide layer 347a'. The barrier layer 351, preferably comprising tantalum, tantalum nitride, titanium nitride, tungsten or tungsten nitride prevents subsequently deposited copper layers from incorporating in and degrading the interlayer dielectric 345 (as previously described).

If, for example, the sputtering chamber 142 is configured for deposition of tantalum nitride layers, a tantalum target 146 is employed. Typically, both argon and nitrogen gas are admitted into the sputtering chamber 142 through one or more gas inlets 360, while a power signal is applied to the target 146 via the DC power supply 200. Optionally, a power signal may also be applied to the pedestal 152 via the RF power supply 202. During steady-state processing, nitrogen may react with the tantalum target 146 to form a nitride film on the tantalum target 146 so that tantalum nitride is sputtered therefrom. Additionally, non-nitrided tantalum atoms are also sputtered from the target, which atoms can combine with nitrogen to form tantalum nitride in flight or on a wafer supported by the pedestal 152.

In operation, a throttle valve operatively coupled to the exhaust outlet 322 is placed in a mid-position in order to maintain the deposition chamber 142 at a desired low vacuum level of about $1\times10^{-8}$ Torr prior to introduction of the process gas(es) into the chamber. To commence processing within the sputtering chamber 142, a mixture of argon and nitrogen gas is flowed into the sputtering chamber 142 via a gas inlet 360. After the gas stabilizes at a pressure of about 0.1–40 milliTorr (preferably 1-5 milliTorr), DC power is applied to the tantalum target 146 via the DC power supply 200. The gas mixture continues to flow into the sputtering chamber 142 via the gas inlet 360 and is pumped therefrom via the pump 320 to maintain gas pressure in the chamber. The DC power applied to the target 146 causes the argon/nitrogen gas mixture to form an SIP plasma and to generate argon and nitrogen ions which are attracted to and strike the target 146, causing target material (e.g., tantalum and tantalum nitride) to be ejected therefrom. The ejected target material travels to and deposits on the wafer 148 supported by the pedestal 152. In accordance with the SIP process, the plasma created by the unbalanced magnetron ionizes a portion of the sputtered tantalum and tantalum nitride. By adjusting the RF power signal applied to the substrate support pedestal 152, a negative bias can be created between the substrate support pedestal 152 and the plasma. The negative bias between the substrate support pedestal 152 and the plasma causes tantalum ions, tantalum nitride ions and argon ions to accelerate toward the pedestal 152 and any wafer supported thereon. Accordingly, both neutral and ionized tantalum nitride may be deposited on the wafer, providing good sidewall and upper sidewall coverage in accordance with SIP sputtering. In addition, particularly if sufficient RF power is optionally applied to the pedestal and power is optionally applied to the electromagnet coils 172, 174, the wafer may be sputter-etched by the argon ions at the same time the tantalum nitride material from the target 146 deposits on the wafer (i.e., simultaneous deposition/sputter-etching).

Following deposition of the barrier layer 351, the portion of the barrier layer 351 at the bottom of the via 349, and the copper oxide layer 347a' (and any processing residue) thereunder, may be sputter-etched or resputtered via an argon plasma as shown in FIG. 8B, if thinning or elimination of the bottom is desired. The argon plasma is preferably generated in this step primarily by applying RF power to the CCP pedestal and power to the electromagnet coils surrounding the pedestal and the processing area between the pedestal and the target. Note that during sputter-etching within the sputtering chamber 142 (FIG. 2) in this embodiment, the power applied to the target 146 is preferably either removed or is reduced to a low level (e.g., 100 or 200 W) so as to inhibit or prevent significant deposition from the target 146. A low target power level, rather than no target power, can provide a more uniform plasma and is presently preferred.

Figure 4:
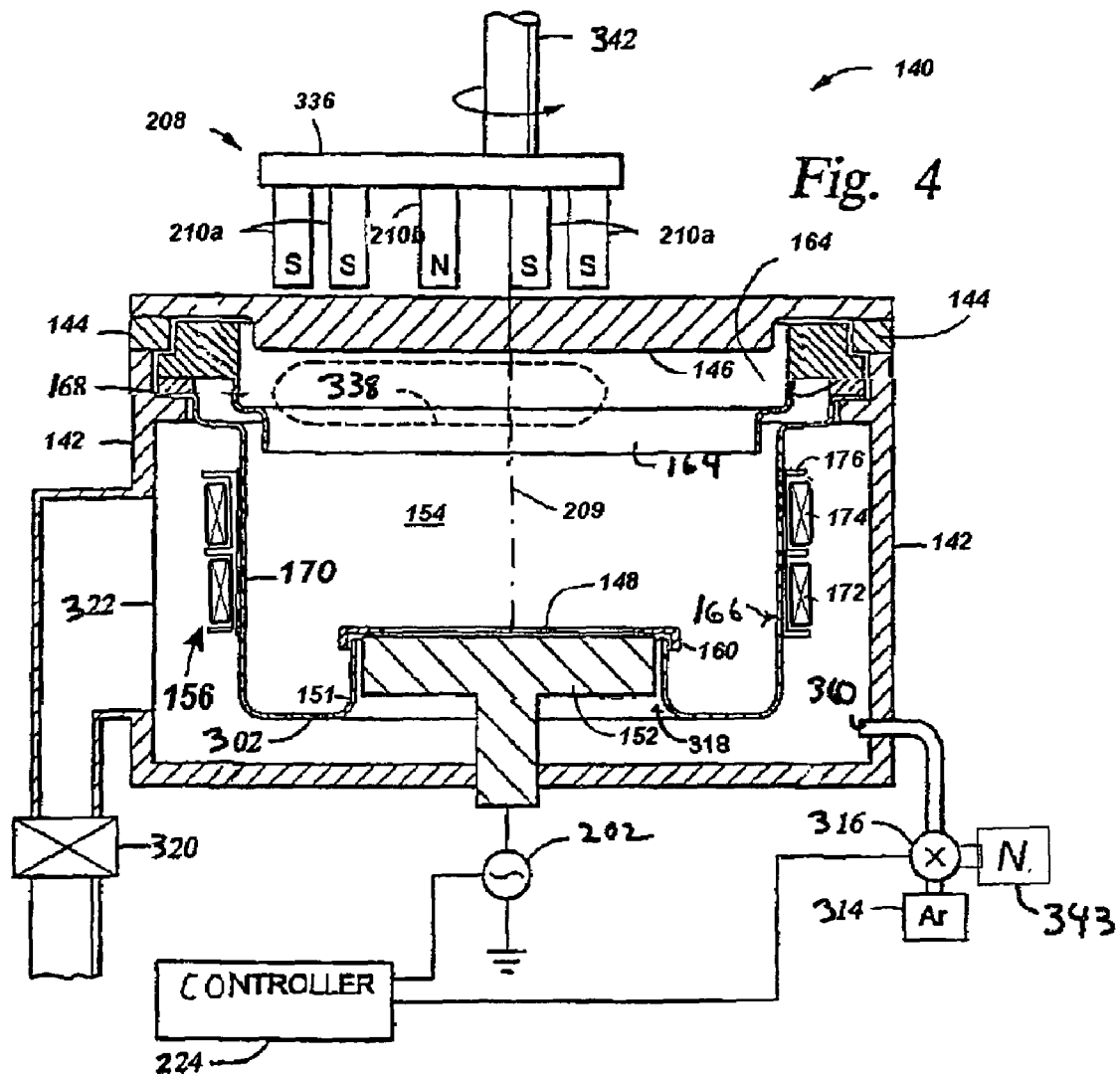
FIG. 4 is a schematic representation of a sputtering chamber usable with an embodiment of the invention.

CCP argon ions are accelerated toward the barrier layer 351 via an electric field (e.g., the RF signal applied to the substrate support pedestal 152 via the second RF power supply 202 of FIG. 4 which causes a negative self bias to form on the pedestal), strike the barrier layer 351, and, due to momentum transfer, sputter the barrier layer material from the base of the via aperture and redistribute it along the portion of the barrier layer 351 that coats the sidewalls of the via 349. The argon ions are attracted to the substrate in a direction substantially perpendicular thereto. As a result, little sputtering of the via sidewall, but substantial sputtering of the via base, occurs. To facilitate resputtering, an appropriate bias is applied through the pedestal to the wafer. The particular values of the resputtering process parameters may vary depending upon the particular application.

Once the barrier layer 351 has been sputter-etched from the via base, the argon ions strike the copper oxide layer 347a', and the oxide layer is sputtered to redistribute the copper oxide layer material from the via base, some or all of the sputtered material being deposited along the portion of the barrier layer 351 that coats the sidewalls of the via 349. Copper atoms 347a", as well, coat the barrier layer 351 deposited on the sidewalls of the via 349. However, because the originally deposited barrier layer 351 along with that redistributed from the via base to via sidewall is a diffusion barrier to the copper atoms 347a", the copper atoms 347a" are substantially immobile within the barrier layer 351 and are inhibited from reaching the interlayer dielectric 345. The copper atoms 347a" which are deposited onto the sidewall, therefore, generally do not generate via-to-via leakage currents as they would were they redistributed onto an uncoated sidewall.

Thereafter, a second liner layer 371 of a second material such as tantalum may be deposited (FIG. 8C) on the previous barrier layer 351 in the same chamber 142 or a similar chamber having both an SIP and CCP capabilities. A tantalum liner layer provides good adhesion between the underlying tantalum nitride barrier layer and a subsequently deposited metal interconnect layer of a conductor such as copper. The second liner layer 371 may be deposited in the same manner as the first liner layer 351. That is, the tantalum liner 371 may be deposited in a first SIP step in which the plasma is generated primarily by the target magnetron 208. However, nitrogen is not admitted so that tantalum rather than tantalum nitride is deposited. In accordance with SIP sputtering, good sidewall and upper sidewall coverage may be obtained. RF power to the CCP pedestal 152 may be reduced or eliminated, if desired.

Following deposition of the tantalum liner layer 371, the portion of the liner layer 371 at the bottom of the via 349 (and any processing residue) thereunder, may be sputter-etched or resputtered via an argon plasma in the same manner as the bottom of the liner layer 351, as shown in FIG. 8D, if thinning or elimination of the bottom is desired. The argon plasma is preferably generated in this step primarily by applying RF power to the CCP pedestal and applying power to the plasma confinement coils 172, 174. Again, note that during sputter-etching within the sputtering chamber 142 (FIG. 2), the power applied to the target 146 preferably is either removed or is reduced to a low level (e.g., 200 W) so as to inhibit or prevent significant deposition from the target 146 during thinning or elimination of the bottom coverage of the second liner layer 371.

In the above described embodiment, SIP deposition of target material on the sidewalls of the vias occurs primarily in one step and CCP resputtering of the via bottoms occurs primarily in a subsequent step. It is appreciated that CCP sputter-etching of the deposited material at the bottom of the via 349 can occur simultaneously with the deposition of target material on the sidewalls, if desired. Simultaneous deposition/sputter-etching may be performed with the chamber 142 of FIG. 4 by adjusting the power signals applied to the target 146, the pedestal 152 and the electromagnet coils 172, 174. Once the sputtering threshold has been reached for a particular wafer bias, the ratio of the RF power applied to the pedestal 152 ("RF pedestal power") as compared to the DC power applied to the target 146 ("DC target power") affects the relationship between sputter-etching and deposition. For instance, the higher the RF:DC power ratio the more sputter-etching can occur due to increased ionization and subsequent increased ion bombardment flux to the wafer. Increasing the wafer bias (e.g., increasing the RF power supplied to the support pedestal 152) can also increase the energy of the incoming ions which will increase the sputtering yield and the etch rate. For example, increasing the voltage level of the RF signal applied to the pedestal 152 can increase the energy of the ions incident on the wafer, while increasing the duty cycle of the RF signal applied to the pedestal 152 can increase the number of incident ions.

Therefore, both the voltage level and the duty cycle of the wafer bias can be adjusted to control sputtering rate. In addition, keeping the DC target power low can decrease the amount of barrier material available for deposition. A DC target power of zero can result in wafer resputtering only. A low DC target power coupled with a high RF pedestal power and DC wafer bias can result in simultaneous via sidewall deposition and via bottom sputtering. Accordingly, the process may be tailored for the material and geometries in question. For a typical 3:1 aspect ratio via on a 200 mm wafer, using tantalum or tantalum nitride as the barrier material, it is believed that the DC target power and RF pedestal power may be applied so as to provide barrier deposition on the wafer sidewalls and removal of material from the via bottom. The lower the DC target power, the less material will be deposited on the sidewalls. The higher the DC target power, the more RF pedestal power is needed to sputter the bottom of the via. It may be desirable to initially (e.g., for several seconds or more depending on the particular geometries/materials in question) apply no wafer bias during SIP deposition to allow sufficient via sidewall coverage to prevent contamination of the sidewalls by material sputter-etched from the via bottom.

For instance, initially applying no wafer bias during SIP deposition of the via 349 can facilitate formation of an initial barrier layer on the sidewalls of the interlayer dielectric 345 that inhibits sputtered copper atoms from contaminating the interlayer dielectric 345 during the remainder of the deposition/sputter-etching operation.

Following deposition of the second liner layer 371 and thinning of the bottom coverage, a second metal layer 347b is deposited (FIG. 8E) to form the copper interconnect 348. The second copper layer 347b may be deposited either uniformly over the second liner layer 371 and over the portion of the first copper layer 347a exposed at the base of each via or so as to form a copper plug 347b' as shown in FIG. 8E. Because the first and second copper layers 347a, 347b are in direct contact, rather than in contact through the barrier layer 351 or the second liner layer 371, the resistance of the copper interconnect 348 can be lower, as can via-to-via leakage currents.

If the interconnect is formed of a different conductor metal than the liner layer or layers, the interconnect layer may be deposited in a sputter chamber having a target of the different conductor metal. The sputter chamber may be an SIP, CCP, or IMP type. The metal interconnect may be deposited by other methods in other types of chambers and apparatus including CVD and electrochemical plating.

Still further, in accordance with another aspect of the present inventions, the interconnect layer or layers may be deposited in a sputter chamber similar to the chamber 142 which generates both SIP and CCP plasmas. If deposited in a chamber such as the chamber 142, the target 146 would be formed of the deposition material, such as copper, for example.

As previously mentioned, the illustrated chamber 142 is capable of self-ionized sputtering of copper including sustained self-sputtering. In this case, after the plasma has been ignited, the supply of argon may be cut off in the case of SSS, and the metal ions may have sufficiently high density to resputter the target with a yield of greater than unity. Alternatively, some argon may continue to be supplied, but at a reduced flow rate and chamber pressure and perhaps with insufficient target power density to support pure sustained self-sputtering but nonetheless with a significant but reduced fraction of self-sputtering. It is believed that if the argon pressure is increased to significantly above 5 milliTorr, the argon will remove energy from the metal ions, thus decreasing the self-sputtering The wafer bias attracts the ionized fraction of the metal particle deep into the hole.

To achieve deeper hole coating with a partially neutral flux, it is desirable to increase the distance between the target 146 and the wafer 148, that is, to operate in the long-throw mode. In long-throw, the target-to-substrate spacing is typically greater than half the substrate diameter, preferably greater than wafer diameter, more preferably at least 80% of the substrate diameter, and most preferably at least 140% of the substrate diameter. The throws mentioned in the examples of the embodiment are referenced to 200 mm wafers. For many applications, it is believed that a target to wafer spacing of 50 to 1000 mm will be appropriate. Long-throw in conventional sputtering reduces the sputtering deposition rate, but ionized sputter particles typically do not suffer a large decrease. Controlled alternation between self-ionized plasma (SIP) sputtering, capacitively coupled plasma (CCP) sputtering and sustained self-sputtering (SSS) allows control of the distribution between neutral and ionized sputter particles.

Figure 9:
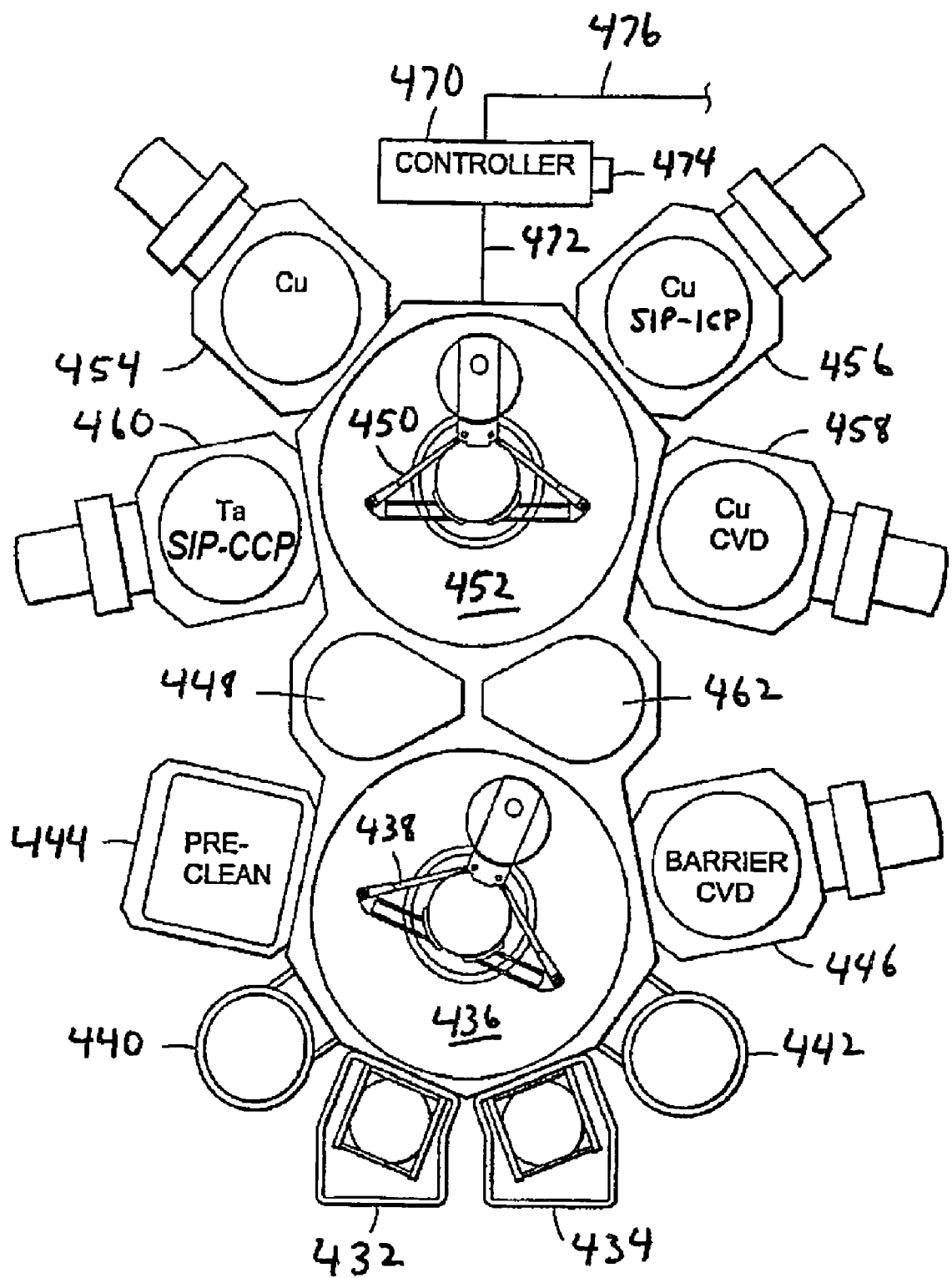
FIG. 9 is a schematic view of a integrated processing tool on which an embodiment of the invention may be practiced.

One embodiment of the present inventions includes an integrated process preferably practiced on an integrated multi-chamber tool, such as the Endura 5500 platform schematically illustrated in plan view in FIG. 9. The platform is functionally described by Tepman et al. in U.S. Pat. No. 5,186,718.

Wafers which previously have been etched with via holes or other structures in a dielectric layer are loaded into and out of the system through two independently operated load lock chambers 432, 434 configured to transfer wafers into and out of the system from wafer cassettes loaded into the respective load lock chambers. After a wafer cassette has been loaded into a load lock chamber 432, 434, the chamber is pumped to a moderately low pressure, for example, in the range of $10^{-3}$ to $10^{-4}$ Torr, and a slit valve between that load lock chamber and a first wafer transfer chamber 436 is opened. The pressure of the first wafer transfer chamber 436 is thereafter maintained at that low pressure.

A first robot 438 located in the first transfer chamber 436 transfers the wafer from the cassette to one of two degassing/orienting chambers 440, 442, and then to a first plasma pre-clean chamber 444, in which a hydrogen or argon plasma cleans the surface of the wafer. If a CVD barrier layer is being deposited, the first robot 438 then passes the wafer to a CVD barrier chamber 446. After the CVD barrier layer is deposited, the robot 438 passes the wafer into a pass through chamber 448, from whence a second robot 450 transfers it to a second transfer chamber 452. Slit valves separate the chambers 444, 446, 448 from the first transfer chamber 436 so as to isolate processing and pressure levels.

The second robot 450 selectively transfers wafers to and from reaction chambers arranged around the periphery. A first IMP sputter chamber 454 may be dedicated to the deposition of copper. An SIP-ICP sputter chamber 456 may be dedicated to the deposition of an SIP-ICP copper nucleation layer. This chamber combines ICP deposition for bottom coverage and SIP deposition for sidewall coverage and reduced overhangs in either a one step or a multi-step process. Also, at least part of the barrier layer (of, for example, Ta/TaN) is deposited by SIP sputtering and CCP resputtering, and therefore an SIP-CCP sputter chamber 460 is dedicated to sputtering a refractory metal, possibly in a reactive nitrogen plasma. The same SIP-CCP chamber 460 may be used for depositing the refractory metal and its nitride. A CVD chamber 458 is dedicated to the deposition of the copper seed layer and possibly used to complete the filling of the hole. Each of the chambers 454, 456, 458, 460 is selectively opened to the second transfer chamber 452 by slit valves. It is possible to use a different configuration. For example, an IMP chamber 454 may be replaced by a second CVD copper chamber, particularly if CVD is used to complete the hole filling.

After the low-pressure processing, the second robot 450 transfers the wafer to an intermediately placed thermal chamber 462, which may be a cool down chamber if the preceding processing was hot, or may be a rapid thermal processing (RTP) chamber if annealing of the metallization is required. After thermal treatment, the first robot 438 withdraws the wafer and transfers it back to a cassette in one of the load lock chambers 432, 434. Of course, other configurations are possible with which the invention can be practiced depending on the steps of the integrated process.

The entire system is directed by a computer-based controller 470 operating over a control bus 472 in communication with sub-controllers associated with each of the chambers. Process recipes are read into the controller 470 by recordable media 474, such as magnetic floppy disks or CD-ROMs, insertable into the controller 470, or over a communication link 476.

Many of the features of the apparatus and process of the inventions can be applied to sputtering not involving long throw. Although it is believed that the inventions are particularly useful at the present time for tantalum and tantalum nitride liner layer deposition, the different aspects of the invention may be applied to sputtering other materials and for other purposes.

It will, of course, be understood that modifications of the present invention, in its various aspects, will be apparent to those skilled in the art, some being apparent only after study, others being matters of routine mechanical and process design. Other embodiments are also possible, their specific designs depending upon the particular application. As such, the scope of the invention should not be limited by the particular embodiments herein described but should be defined only by the appended claims and equivalents thereof.

What is claimed is:

1. A method of sputter depositing deposition material onto a substrate supported by a pedestal in a chamber, comprising:
    rotating a magnetron about the back of a target in the chamber, said magnetron having an area of no more than about ¼ of the area of the target and including an inner magnetic pole of one magnetic polarity surrounded by an outer magnetic pole of an opposite magnetic polarity, a magnetic flux of said outer pole being at least 50% larger than the magnetic flux of said inner pole;
    applying power to said target to thereby sputter material from said target onto said substrate at a first rate;
    applying RF power to said pedestal to provide a plasma to resputter deposition material on said substrate; and
    confining said plasma using a magnetic field generated by electromagnetic coils disposed around the periphery of the pedestal.

2. The method of claim 1 wherein said target is spaced from said pedestal by a throw distance that is greater than 50% of a diameter of the substrate.

3. The method of claim 1 further comprising inhibiting sputtering said target while resputtering target material on said substrate.

4. The method of claim 3 wherein said inhibiting includes reducing the power applied to said target.

5. The method of claim 4 wherein the power applied to said target is reduced to less than 1 kW.

6. The method of claim 5 wherein the power applied to said target is reduced to 100–200 watts.

7. The method of claim 3 wherein said inhibiting includes reducing the voltage applied to said target.

8. The method of claim 7 wherein the voltage applied to said target is reduced to zero volts.

9. The method of claim 1 further comprising inhibiting sputtering said target while resputtering target material on said substrate wherein said inhibiting includes reducing the power applied to said target to 100–200 watts and wherein said confining includes applying 5 A of current to a first electromagnetic coil.

10. The method of claim 1 wherein said confining includes applying 5 A of current to a first electromagnetic coil.

11. The method of claim 1 wherein said confining includes applying 10 A of current to a first electromagnetic coil.

12. The method of claim 11 wherein said confining includes applying −5 A of current to a second electromagnetic coil.

13. The method of claim 1 further comprising raising the pressure of said chamber while resputtering said substrate.

14. The method of claim 1 wherein RF power is applied in a range of 150–300 watts while sputtering material from said target.

15. The method of claim 1 wherein said chamber has an internal pressure of 1–10 mTorr during said resputtering.

16. The method of claim 15 wherein said chamber has an internal pressure of 1–5 mTorr during said resputtering.

17. The method of claim 16 wherein said chamber has an internal pressure of 2 mTorr during said resputtering.

18. The method of claim 15, wherein said target is spaced from said pedestal by a throw distance that is greater than 50% of a diameter of the substrate and wherein said pressure is less than 5 milliTorr.

19. The method of claim 18, wherein said throw distance is greater than 80% of said diameter of the substrate.

20. The method of claim 19, wherein said throw distance is greater than 140% of said diameter of the substrate.

21. The method of claim 1 wherein said deposition material is tantalum nitride.

22. The method of claim 1 wherein said deposition material is tantalum.

23. The method of claim 1, wherein said material is one of tantalum and tantalum nitride which is deposited into a hole formed in a dielectric layer of said substrate and having an aspect ratio of at least 4:1.

24. A method of sputter depositing a layer of metal material into a plurality of holes on a substrate, comprising:
provide a chamber having a target spaced from a pedestal for holding a substrate to be sputter coated by a throw distance that is greater than 50% of a diameter of the substrate;
rotating a magnetron about the back of the target, said magnetron having an area of no more than about ¼ of the area of the target and including an inner magnetic pole of one magnetic polarity surrounded by an outer magnetic pole of an opposite magnetic polarity, the magnetic flux of said outer pole being at least 50% larger than the magnetic flux of said inner pole;
applying at least 10 kW of DC power to said target while said chamber is pumped to a vacuum pressure, to thereby sputter material from said target onto said substrate and to maintain a self ionizing plasma to ionize at least a portion of said material sputtered from said target;
biasing said substrate to attract sputtered material ions;
reducing said DC power applied to said target after depositing a layer of target material into holes on said substrate;
supplying a precursor gas into said chamber;
applying RF power to said pedestal to capacitively couple RF energy into a plasma to ionize said precursor gas and to bias said substrate to attract ionized gas to resputter target material from the bottom of the holes of said substrate; and
generating a magnetic field to surround said pedestal and confine said plasma to increase the density of said plasma.

25. A plasma sputter reactor system for sputter depositing a film on a substrate, comprising:
a vacuum chamber containing a pedestal aligned to a chamber axis and having a support surface for supporting a substrate to be sputter deposited;
a first power source coupled to said pedestal and adapted to provide RF power to said pedestal;
a target comprising a material to be sputter deposited on said substrate and electrically isolated frown said vacuum chamber;
a second power source coupled to said target and adapted to provide power to said target to bias said target;
a magnetron disposed adjacent said target and having an area of no more than about ¼ of the area of the target and including an inner magnetic pole of one magnetic polarity surrounded by an outer magnetic pole of an opposite magnetic polarity, the magnetic flux of said outer pole being at least 50% larger than the magnetic flux of said inner pole;
a first electrically conductive shield generally symmetric about said axis, supported on and electrically connected to said chamber, and extending away from said target along a wall of said chamber to an elevation behind said support surface;
an electromagnetic coil carried by said first shield and surrounding said shield;
a third power source coupled to said coil and adapted to energize said coil to generate a magnetic field surrounding said pedestal; and
a controller adapted to control said second power source to sputter said target in a first interval at a first power level and to reduce said power level to a second level in a second interval wherein target material is sputtered on said substrate primarily in said first interval, said controller being further adapted to control said first power source to provide RF power to said pedestal to bias a substrate on said pedestal and to capacitively couple RF power to maintain a plasma in said chamber in said second interval wherein target material deposited on said substrate in said first interval is resputtered from said substrate in said second interval, and said controller being further adapted to control said third power source to provide a magnetic field to surround said pedestal and confine said plasma to increase the density of said plasma in said second interval.

26. The reactor system of claim 25 wherein said controller is adapted to control the pressure in said chamber to a pressure of no more than 5 milliTorr during at least a portion of said sputtering during said first interval.

27. The reactor system of claim 25 wherein said controller is adapted to control the pressure in said chamber to a pressure of no more than 5 milliTorr during at least a portion of said resputtering during said second interval.

28. The reactor system of claim 26 wherein said chamber has an internal pressure of 2 mTorr while resputtering said substrate.

29. The reactor system of claim 26 wherein said controller is adapted to raise the pressure of said chamber while resputtering said substrate.

30. The reactor system of claim 25 wherein said target is spaced from said pedestal by a throw distance that is greater than 50% of a diameter of the substrate.

31. The reactor system of claim 30, wherein said throw distance is greater than 80% of said diameter of the substrate.

32. The reactor system of claim 31, wherein said throw distance is greater than 140% of said diameter of the substrate.

33. The reactor system of claim 25 wherein during said second interval, said target power is less than 1 kW.

34. The reactor system of claim 33 wherein during said second interval, said target power is 100–200 Watts.

35. The reactor system of claim 25 wherein during said first interval, said target power is at least 10 kW DC.

36. The reactor system of claim 35 wherein during said first interval, said target power is at least 20 kW DC.

37. The reactor system of claim 25 wherein said controller is adapted to control said third source to provide no power to said coil during said sputter deposition of said first interval.

38. The reactor system of claim 25 wherein said controller is adapted to control said second power source to reduce the voltage applied to said target during said second interval.

39. The reactor system of claim 38 wherein said controller is adapted to control said second power source to reduce the voltage applied to said target to zero volts.

40. The reactor system of claim 25 wherein during said second interval, said target power is 100–200 Watts and wherein during said first interval, said target power is at least 20 kW DC.

41. The reactor system of claim 25 wherein said controller is adapted to control said third power source to energize said electromagnetic coil with 5 A of current during said second interval.

42. The reactor system of claim 25 wherein said controller is adapted to control said third power source to energize said electromagnetic coil with 10 A of current during said second interval.

43. The reactor system of claim 42 further comprising a second electromagnetic coil carried by said first shield and surrounding said shield, and a fourth power source coupled to said coil and adapted to energize said second coil to generate a magnetic field surrounding said pedestal, and wherein said controller is adapted to control said fourth power source to energize said second electromagnetic coil with −5 A of current.

44. The reactor system of claim 25 wherein said target material is tantalum.

45. The reactor system of claim 44 further comprising an inlet adapted to provide nitrogen wherein said controller is adapted to control said inlet to provide nitrogen in said chamber while said target is sputtered wherein tantalum nitride is deposited onto said substrate.

* * * * *